(12) United States Patent
Brcka

(10) Patent No.: US 7,075,771 B2
(45) Date of Patent: Jul. 11, 2006

(54) APPARATUS AND METHODS FOR COMPENSATING PLASMA SHEATH NON-UNIFORMITIES AT THE SUBSTRATE IN A PLASMA PROCESSING SYSTEM

(75) Inventor: Jozef Brcka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 464 days.

(21) Appl. No.: 10/442,815

(22) Filed: May 21, 2003

(65) Prior Publication Data

US 2004/0233608 A1 Nov. 25, 2004

(51) Int. Cl.
*H02H 1/00* (2006.01)
(52) U.S. Cl. .................................... 361/234
(58) Field of Classification Search ............... 361/234; 156/345; 219/121.43
See application file for complete search history.

(56) References Cited

U.S. PATENT DOCUMENTS

| | | | |
|---|---|---|---|
| 5,226,967 A | 7/1993 | Chen et al. ............... 118/723 |
| 5,368,710 A | 11/1994 | Chen et al. ........... 204/192.32 |
| 5,377,071 A | 12/1994 | Moslehi ..................... 361/234 |
| 5,522,131 A | 6/1996 | Steger ......................... 29/829 |
| 5,548,470 A | 8/1996 | Husain et al. .............. 361/234 |
| 5,675,471 A | 10/1997 | Kotecki ...................... 361/234 |
| 5,688,358 A | 11/1997 | Tanaka et al. .............. 156/345 |
| 5,745,331 A | 4/1998 | Shamouilian et al. ...... 361/234 |
| 5,753,132 A | 5/1998 | Shamouilian et al. ........ 216/33 |
| 5,761,023 A | 6/1998 | Lue et al. ................... 361/234 |
| 5,863,396 A | 1/1999 | Flanigan ................. 204/298.11 |
| 5,880,924 A | 3/1999 | Kumar et al. ............... 361/234 |
| 5,886,865 A | 3/1999 | Parkhe et al. .............. 361/234 |
| 5,886,866 A | 3/1999 | Hausmann ................. 361/234 |
| 5,903,428 A | 5/1999 | Grimard et al. ............ 361/234 |
| 5,917,327 A | 6/1999 | Haley et al. ................ 324/457 |
| 5,986,873 A | 11/1999 | Thomas ..................... 361/234 |
| 5,986,874 A | 11/1999 | Ross et al. .................. 361/234 |
| 6,033,478 A | 3/2000 | Kholodenko ............... 118/500 |
| 6,039,836 A | 3/2000 | Dhindsa et al. ............ 156/345 |
| 6,040,562 A | 3/2000 | Tokumoto et al. .......... 219/530 |
| 6,042,686 A * | 3/2000 | Dible et al. ............ 156/345.44 |

(Continued)

FOREIGN PATENT DOCUMENTS

EP 0663682 A1 7/1995

(Continued)

OTHER PUBLICATIONS

European Patent Office, International Search Report for International Application No. PCT/US2004/105892, Mailing Date: Dec. 30, 2004.

*Primary Examiner*—Brian Sircus
*Assistant Examiner*—Boris Benenson
(74) *Attorney, Agent, or Firm*—Wood, Herron & Evans, L.L.P.

(57) ABSTRACT

Apparatus and methods to compensating for radial non-uniformities in the plasma sheath at a substrate held by an electrostatic chuck in a plasma processing system. The substrate is held by a substrate-supporting surface of the electrostatic chuck. The substrate-supporting surface is modified by providing a pattern of features characteristic of a compensating structure that corrects the radial non-uniformities in the plasma sheath and then covering the features conformally with a planarization coating of a dielectric material. The dielectric material fills and covers the pattern of features to provide multiple parallel capacitances defining the compensating structure. The pattern of features characterizing the compensating structure may be determined from a radial non-uniformity in a plasma-related parameter at the substrate-supporting surface.

26 Claims, 12 Drawing Sheets

U.S. PATENT DOCUMENTS

| | | | |
|---|---|---|---|
| 6,072,147 A * | 6/2000 | Koshiishi et al. | 219/121.43 |
| 6,108,189 A | 8/2000 | Weldon et al. | 361/234 |
| 6,134,096 A | 10/2000 | Yamada et al. | 361/234 |
| 6,155,199 A * | 12/2000 | Chen et al. | 118/723 I |
| 6,163,448 A | 12/2000 | Hausmann | 361/234 |
| 6,175,485 B1 | 1/2001 | Krishnaraj et al. | 361/234 |
| 6,188,564 B1 | 2/2001 | Hao | 361/234 |
| 6,202,590 B1 | 3/2001 | Kim et al. | 118/723 |
| 6,214,413 B1 | 4/2001 | Brown | 427/282 |
| 6,239,403 B1 | 5/2001 | Dible et al. | 219/121.43 |
| 6,257,168 B1 | 7/2001 | Ni et al. | 118/723 |
| 6,258,227 B1 | 7/2001 | Flanigan | 204/298.11 |
| 6,267,839 B1 | 7/2001 | Shamouilian et al. | 156/345 |
| 6,273,958 B1 | 8/2001 | Shamouilian et al. | 118/728 |
| 6,278,600 B1 | 8/2001 | Shamouilian et al. | 361/234 |
| 6,286,451 B1 | 9/2001 | Ishikawa et al. | 118/723 |
| 6,310,755 B1 | 10/2001 | Kholodenko et al. | 361/234 |
| 6,331,701 B1 * | 12/2001 | Chen et al. | 250/251 |
| 6,341,574 B1 | 1/2002 | Bailey, III et al. | 118/723 |
| 6,370,004 B1 | 4/2002 | Yamaguchi | 361/234 |
| 6,370,006 B1 | 4/2002 | Kumar | 361/234 |
| 6,395,095 B1 | 5/2002 | Jones et al. | 118/728 |
| 6,413,358 B1 | 7/2002 | Donohoe | 156/345 |
| 6,414,834 B1 | 7/2002 | Weldon et al. | 361/234 |
| 6,431,112 B1 | 8/2002 | Sill et al. | 118/723 |
| 6,459,066 B1 * | 10/2002 | Khater et al. | 219/121.41 |
| 6,500,300 B1 | 12/2002 | Donohoe | 156/345.35 |
| 6,506,685 B1 | 1/2003 | Li et al. | 438/710 |
| 6,512,333 B1 * | 1/2003 | Chen | 315/111.21 |
| 6,528,751 B1 * | 3/2003 | Hoffman et al. | 219/121.43 |
| 2001/0009139 A1 | 7/2001 | Shan et al. | 118/723 |
| 2001/0049196 A1 | 12/2001 | Patrick et al. | 438/689 |
| 2002/0004309 A1 | 1/2002 | Collins et al. | 438/719 |
| 2002/0036881 A1 | 3/2002 | Shamouilian et al. | 361/234 |
| 2002/0059981 A1 | 5/2002 | Hao et al. | 156/345.47 |
| 2002/0066531 A1 | 6/2002 | Ke et al. | 156/345.1 |
| 2002/0186018 A1 | 12/2002 | Sill et al. | |

FOREIGN PATENT DOCUMENTS

WO  WO 95/20838  8/1995

* cited by examiner

APPARATUS AND METHODS FOR COMPENSATING PLASMA SHEATH NON-UNIFORMITIES AT THE SUBSTRATE IN A PLASMA PROCESSING SYSTEM

FIELD OF THE INVENTION

This invention relates to plasma processing systems and, in particular, to electrostatic chucks for plasma processing systems that improve the plasma sheath uniformity at the substrate-supporting surface of the chuck.

BACKGROUND OF THE INVENTION

Electrostatic chucks are used for securing substrates, such as semiconductor wafers, in vacuum chambers of plasma processing systems. Generally, an electrostatic chuck includes a dielectric body and one or more electrodes embedded within the dielectric body. A chucking voltage applied to the electrodes establishes a clamping force by operation of Coulomb's law. The clamping force attracts the substrate toward a wafer-supporting surface of the dielectric body and holds the backside of the substrate in contact with the wafer-supporting surface. The exposed surface of the clamped substrate is subjected to a plasma process including, but not limited to, plasma cleaning, plasma etching, and plasma-enhanced deposition. After the plasma process is concluded, the clamping voltage is removed to release or dechuck the substrate.

The uniformity of the plasma processing of the substrate's exposed surface is a function of the uniformity of ion flux and ion energy, among other variables. The electrostatic chuck in inductively-coupled plasma (ICP) source systems may be biased independently with radio-frequency power so that the ion energy at the substrate can be varied without varying the ion flux at the substrate. The uniformity of the ion flux at the substrate is primarily determined by the plasma density distribution. Plasma density distributions in a plasma processing system equipped with an ICP source exhibit a prominent central peak near the azimuthal centerline of the chamber and decrease radially from the central peak toward the sidewall, which is typically cylindrical. FIG. 1 shows the radial dependence of the electron density and plasma temperature in a prior art ICP processing system. Therefore, the uniformity of the plasma processing is reduced by the radial dependence of the plasma density distribution, which is of particular concern for large diameter substrates.

Conventional techniques for reducing the central peak and, thereby, improving the uniformity of the plasma density distribution, include incorporating antennas having multiple coil configurations, introducing additional magnetic fields, and tailoring the dimensions and material of the substrate support pedestal. Although these techniques improve the uniformity of the plasma density distribution, the contribution of the chamber sidewall to the radial decrease in the plasma density distribution remains unaffected. Increasing the diameter of the sidewall lessens the radial non-uniformity but adds significant cost to the manufacture of the plasma processing system.

As mentioned above, plasma losses originating from the chamber sidewall contribute significantly to nonuniformity of the plasma density distribution. Attempts have been made to compensate sidewall effects by increasing the dimensions of the ICP source dielectric window, which must be robust and thus expensive, and by adding control units, power supplies, and cooling systems, which also adds hardware complexity. In plasma processing systems for large dimension substrates, such corrective measures increase material and consumables expenses, add complexity, and result in an increased cost of operation. As a result, the overall cost of the plasma processing system is significantly increased.

Therefore, there is a need for apparatus and methods for adjusting a parameter related to plasma conditions at the substrate-supporting surface of an electrostatic chuck.

SUMMARY OF THE INVENTION

The present invention overcomes the foregoing and other shortcomings and drawbacks of plasma processing systems heretofore known. While the invention will be described in connection with certain embodiments, it will be understood that the invention is not limited to these embodiments. On the contrary, the invention includes all alternatives, modifications and equivalents as may be included within the spirit and scope of the present invention.

In one aspect, the invention relates to a method to compensate for radial non-uniformity of a plasma-related parameter at a substrate-supporting surface of an electrostatic chuck. The method includes characterizing the radial non-uniformity in the plasma-related parameter and selecting a compensating structure having a specific capacitance for capable of substantially compensating for the radial non-uniformity in the plasma-related parameter. The presence of the compensating structure makes the effective specific capacitance uniform over the extent of the substrate-supporting surface. The substrate-supporting surface is modified for providing a pattern of features characteristic of the compensating structure and then covered conformally with a planarization coating of a dielectric material. The dielectric material fills the pattern of features to provide the compensating structure.

In another aspect, the invention is directed to an electrostatic chuck for a plasma processing system that includes a chamber having a substrate-supporting surface and a plasma generator operative for generating a plasma. The plasma has a plasma sheath characterized by a radial non-uniformity at the substrate-supporting surface. The substrate support surface is provided with a compensating structure capable of substantially compensating for the radial non-uniformity in the plasma by making the effective specific capacitance uniform over the extent of the substrate-supporting surface. The compensating structure includes a pattern of features formed in the substrate support surface and a first dielectric material filling and covering the pattern of features to provide the compensating structure.

In accordance with the principles of the invention, radial non-uniformities in the plasma sheath, and hence a plasma-related parameter, are compensated adjacent to the substrate-supporting surface over the area of the substrate-supporting surface or, at the least, over an area of at least the size of a substrate being processed. The radial uniformity of substrate plasma processing is improved with a minimal impact on the overall system cost as the only system modifications are to the electrostatic chuck holding the substrate. For example, the principles of the invention may be implemented in a plasma processing system without modifying other elements of the system design, such as the RF generator, antenna or matching unit. The improvement in the plasma-related parameter is achieved without deviating significantly from developed processes and technology, which minimizes developmental and manufacturing costs associated with implementing the principles of the invention.

The compensating structures of the invention may be used in any ICP plasma processing system for improving the uniformity of the plasma-surface interaction on the substrate for conventional processes, such as plasma etching, sputtering, deposition, and cleaning. Compensating structures of dielectric material fabricated in accordance with the principles of the invention can be applied to any surface in a plasma processing system that is exposed to the plasma, such as the chamber walls and deposition shields, for controlling the uniformity of the plasma-surface interaction with the plasma-exposed surface.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE PREFERRED EMBODIMENTS

Figure 1:
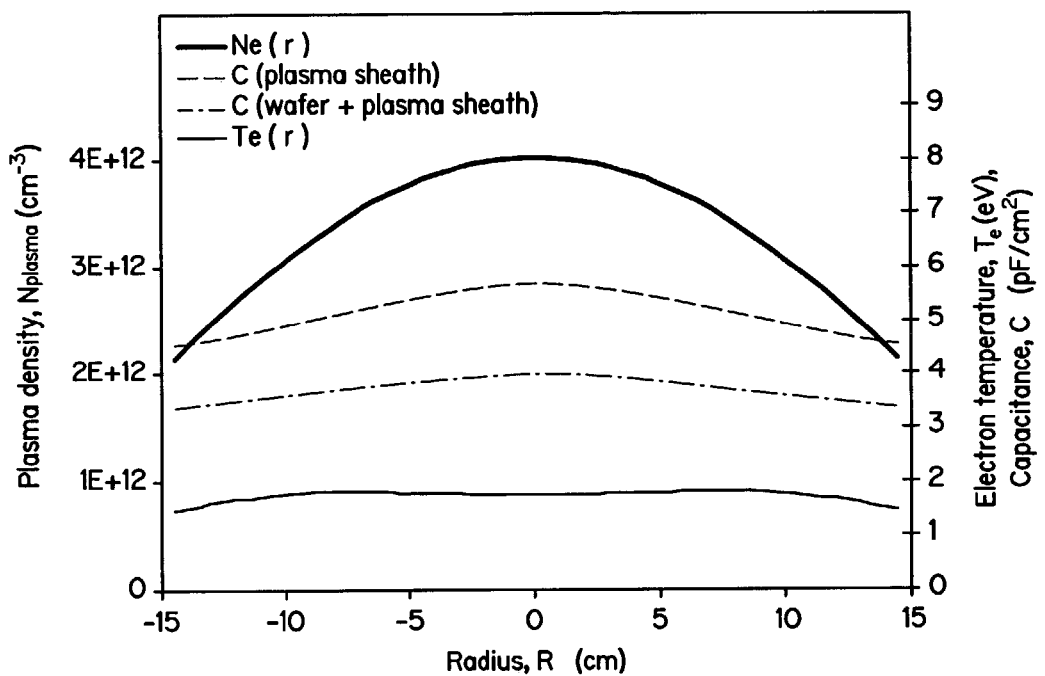
FIG. 1 is a graphical representation of the plasma density, the electron temperature, the plasma sheath capacitance, and the sum of the plasma sheath capacitance and wafer capacitance for a portion of a plasma proximate to the substrate-supporting surface of an electrostatic chuck in a plasma processing system in accordance with the prior art.
Figure 2:
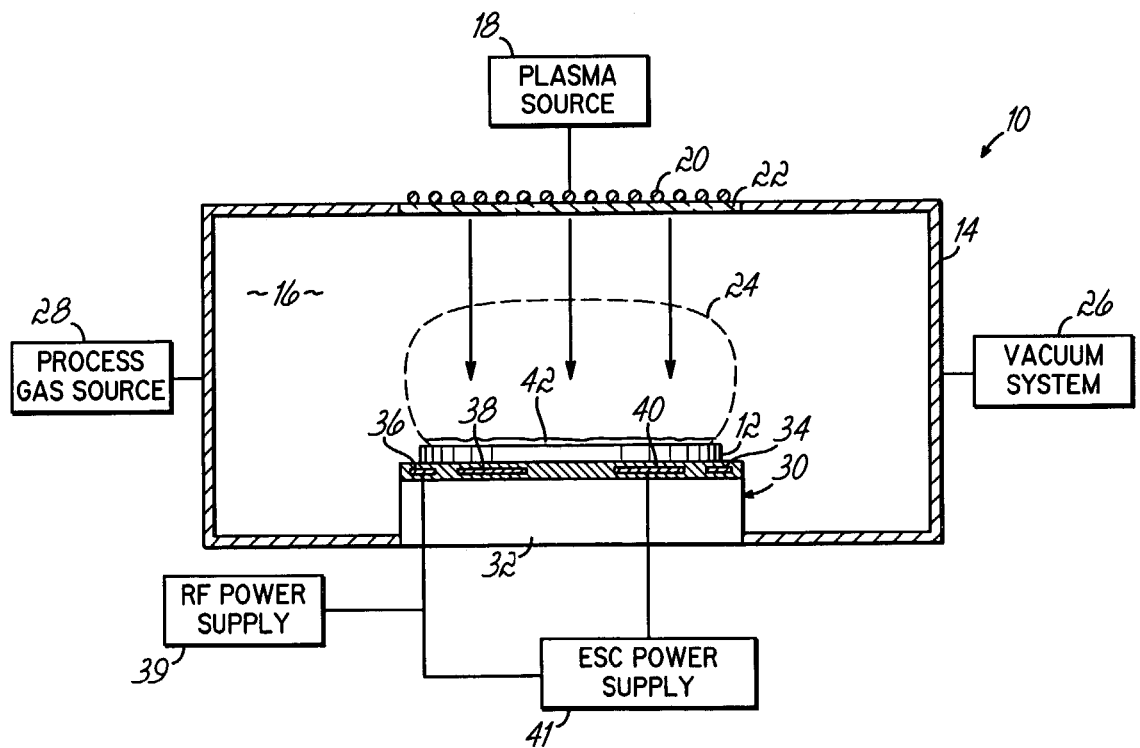
FIG. 2 is a schematic diagram of a plasma processing system in accordance with the principles of the invention.

With reference to FIG. 2, a plasma processing system 10 operable for treating a substrate 12, such as a semiconductor wafer, with an inductively-coupled plasma (ICP) is depicted. Processing system 10 includes a processing chamber 14 that encloses a processing space 16 with a grounded sidewall. The processing system 10 is provided with a plasma power source 18 electrically connected in a known manner to an antenna 20 positioned adjacent to a planar dielectric window 22, which forms a sealed portion of the processing chamber 14. The plasma power source 18 conventionally includes a radio-frequency (RF) power supply and appropriate RF matching circuitry adapted for efficient coupling of RF power, typically at 13.56 MHz, to the antenna 20. Antenna 20 directs RF power through the dielectric window 22 into the processing space 16 for generating and sustaining a plasma 24 in processing space 16 by interacting with a rarified atmosphere of a partial pressure of process gas, such as argon, provided in processing chamber 14. Typically, the plasma power source 18 operates at a frequency of between about 440 kHz and about 13.56 MHz and outputs an RF power of up to about 5000 watts. Collectively, the plasma power source 18, antenna 20 and dielectric window 22 define a plasma generator operative to generate plasma 24 in processing space 16, which is used for processing an exposed surface of substrate 12.

Processing chamber 14 is coupled to an appropriate vacuum system 26 equipped with vacuum pumps and vacuum valves, as are known in the art, suitable for evacuating processing space 16. Processing chamber 14 is also coupled to an appropriate process gas source 28 that introduces a process gas at a regulated pressure suitable for forming plasma 24. Process gas source 28 includes conventional mass flow controllers for regulating the supply of process gas to the processing space 16. Any appropriate gas-dispersing element (not shown) may be coupled to process gas source 28 for uniformly introducing the process gas into processing space 16.

Processing system 10 is illustrative of plasma processing systems in which the principles of the invention may be incorporated. It is contemplated by the invention that other types of plasma processing systems may benefit from the principles of the invention manifested by a reduction in radial non-uniformity of a plasma-related parameter. Accordingly, the principles of the invention are not limited to any specific plasma processing system.

With continued reference to FIG. 2, an electrostatic chuck (ESC) 30 is mounted within the processing chamber 14 opposite to the antenna 20. The electrostatic chuck 30 is used to heat or cool the substrate 12, electrically bias the substrate 12, and support the substrate 12 in a stationary state proximate the plasma 24 in the vacuum processing space 16. The electrostatic chuck 30 includes a metal body 32 covered by a planarization dielectric coating 34. The planarization dielectric coating 34 has a substrate-supporting surface 36 that faces the plasma 24 and upon which the substrate 12 is positioned. Electrodes 38, 40 embedded in the planarization dielectric coating 34 are biased with a DC clamping voltage supplied by a variable, high-voltage power supply 39. An RF power supply 41 is electrically coupled with the electrodes 38, 40 for providing a time-dependent DC bias that attracts ions and radicals from the plasma 24 to the exposed surface of the substrate 12. Electrostatic chuck 30 incorporates other conventional structures as understood by persons of ordinary skill in the art, such as heating elements, temperature sensors, and passageways for heat transfer gas.

When plasma 24 is present in the processing chamber 14, the electron density ($n_e$) and the electron temperature ($T_e$) are functions of the spatial location within plasma 24 and functions of plasma conditions, such are gas pressure ($p_{Ar}$), input RF power ($P_{RF}$), electrode geometry, and coil geometry. Formally, this dependence can be expressed as:

$$n_e = n_e(f(x, y, z), p_{Ar}, P_{RF}, \xi_i)$$

and $$T_e = T_e(f(x, y, z), p_{Ar}, P_{RF}, \xi_i)$$

where ($\xi_i$) denotes the parameter(s) related to other arbitrary plasma and system conditions.

With continued reference to FIG. 2, a plasma sheath 42 is formed between the bulk plasma 24 and the exposed surface of the substrate 12. A plasma sheath (not shown) is also formed adjacent the grounded sidewall of processing chamber 14 and any other plasma-exposed surface inside processing chamber 14. The thickness of the plasma sheath ($d_S$) is defined as the thickness of the region where the electron density is negligible and where the potential drop ($V_S = V_P - V_B$) occurs, where $V_P$ is the plasma potential and the $V_B$ is the bias on the surface either from an external source, such as power supplies 39, 41, or self-bias. As a first approximation, the thickness of the plasma sheath 42 is related to the Debye length $d_S \sim \lambda_D$, which is given by:

$$\lambda_D = \sqrt{\frac{\varepsilon_0 k T_e}{n_e e^2}}$$

or approximately $$\lambda_D(\text{cm}) \approx 743 \sqrt{\frac{T_e(\text{eV})}{n_e(\text{cm}^{-3})}}$$

and also depends on the collisional mean free path in the plasma and is affected by external biases applied to the surface (where $\varepsilon_0 = 8.85 \times 10^{-12}$ F/m is the absolute permittivity, $e = 1.6022 \times 10^{-19}$ coulombs, and $k = 1.3807 \times 10^{-23}$ J/K is the Boltzman constant). However, practical sheath thicknesses are considerably larger than Debye length. At pressures exceeding about 100 mTorr, the thickness of the plasma sheath 42 can be estimated from:

$$d_s \approx \eta^{2/3} \lambda_D$$

and at pressures less than about 100 mTorr, the sheath thickness can be estimated from:

$$d_s \approx 1.1 \eta^{3/4} \lambda_D$$

where $$\eta = \frac{e(V_P - V_B)}{kT_e}.$$

In low pressure plasmas generated with an ICP plasma source, the electron temperature is relatively small, around 1–2 eV, and biases up to about –100 VDC, such that the plasma sheath thickness is about $d_s \approx 32\lambda_D$.

At an excitation frequency of 13.56 MHz, the electrical properties of the plasma sheath 42 are characterized by a capacitance determined by the surface area (A) of the substrate-supporting surface 36 and the thickness of the plasma sheath 42. The sheath capacitance is given by:

$$C_{sheath} = \varepsilon_r \varepsilon_0 \frac{A}{d_s}$$

in which $\epsilon_r = 1$.

The sheath capacitance may be expressed as a function of the plasma parameters, electron density and the electron temperature. Due to radial non-uniformities in the electron density and electron temperature, the capacitance of the plasma sheath 42 at the substrate-supporting surface 36 facing the plasma 24 will be radially non-uniform. The capacitance of the plasma sheath 42 per unit area at the substrate-supporting surface 36 of the electrostatic chuck 30, after substituting for $d_S$, is expressed as:

$$C_{sheath}^{ESC} = 1.224 \times 10^{-3} \varepsilon_r \varepsilon_0 n_e^{1/2} T_e^{1/4} (V_p - V_B)^{3/4}$$

where electron density ($n_e$) is in cm$^{-3}$, electron temperature ($T_e$) is in eV, and potentials ($V_B$) and ($V_P$) are in volts, and ($\epsilon_r$) is the dielectric constant of a vacuum. Similarly, on the grounded sidewall of processing chamber 14, the specific capacitance of the plasma sheath 42 can be expressed as:

$$C_{sheath}^{wall} = C_{sheath}^{wall}(n_e, T_e), \, e.g. \, C_{sheath}^{wall} = 1.224 \times 10^{-3} \varepsilon_r \varepsilon_0 n_e^{1/2} T_e^{1/4} V_p^{3/4}$$

These relationships may be used for estimating the specific capacitance over electrostatic chuck 30 or, using the latter expression, any other plasma-exposed surface in plasma processing system 10.

The sheath capacitance possesses radial inhomogeneities or non-uniformities manifested by radial non-uniformities in plasma parameters, such as electron density, electron temperature, or plasma potential, or by radial non-uniformities in process parameters such as etch rate, deposition rate, and film thickness. Plasma properties are measured proximate to the substrate-supporting surface 36 of the electrostatic chuck 30 and process properties are evaluated by examining the processed wafer. The design process will be described below in relation to FIG. 15.

Figure 3:
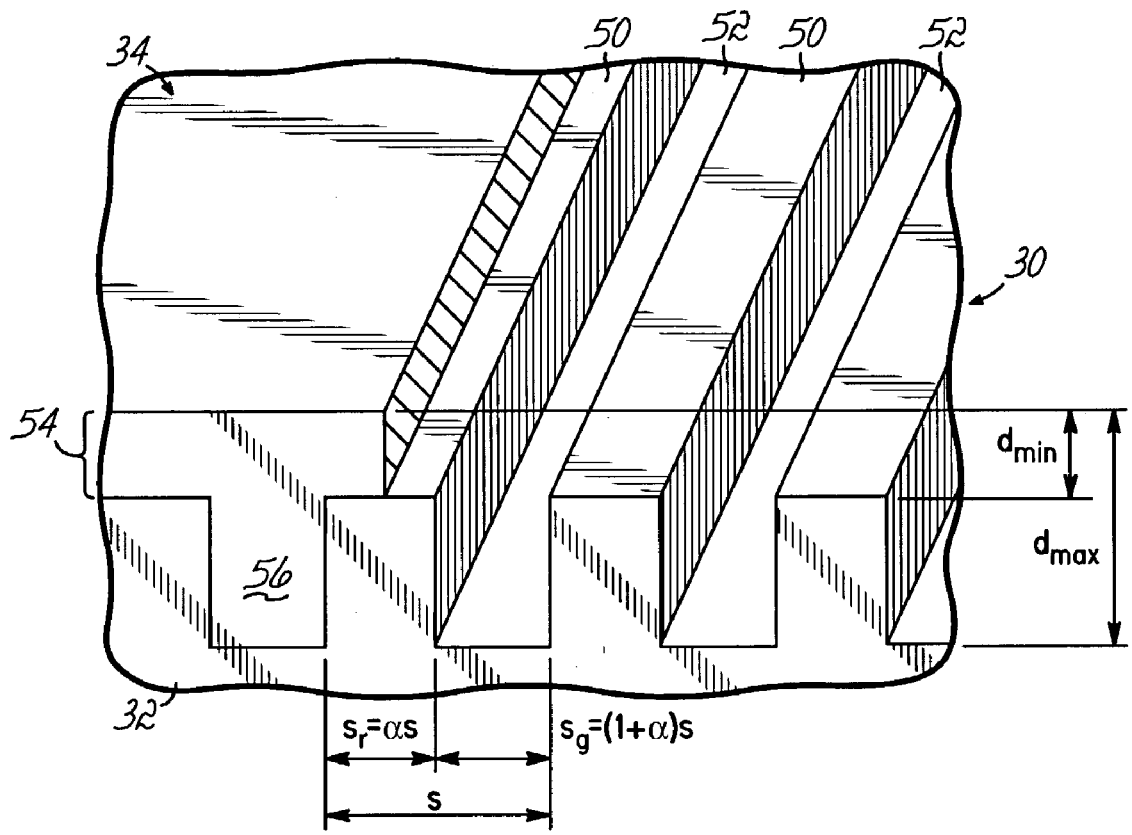
FIG. 3 is a fragmentary perspective view shown partially in cross-section of a portion of the electrostatic chuck of FIG. 2 in accordance with the principles of the invention.
Figure 3A:
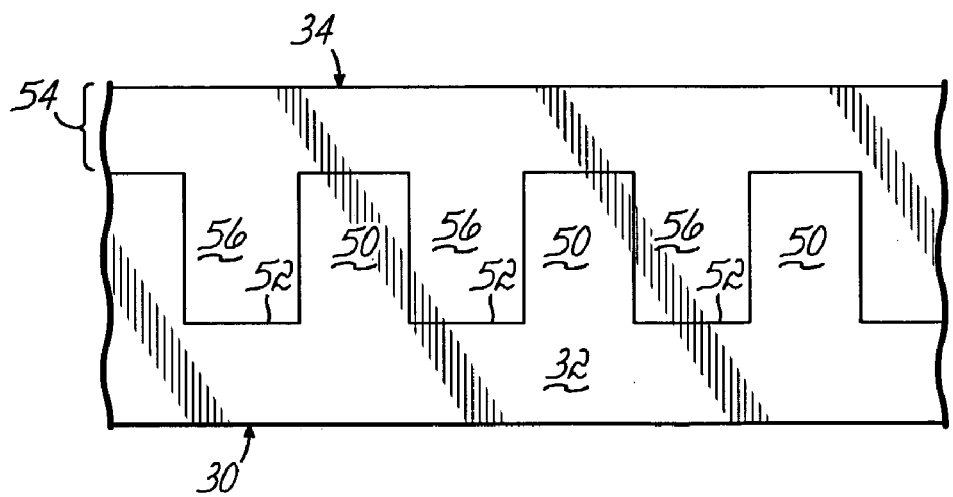
FIG. 3A is a side view of FIG. 3.

With reference to FIGS. 3 and 3A and in accordance with one embodiment of electrostatic chuck 30, metal body 32 includes a plurality of equally-spaced, substantially parallel ridges 50. Adjacent ridges 50 are separated by one of a plurality of voids or grooves 52 for collectively defining a one-dimensional grid. The periodicity of the grid measured center-to-center between either adjacent ridges 50 or adjacent grooves 52 is given by a pitch ($s=s_r+s_g$), in which the groove width is defined as $s_g=(1-\alpha)s$, the ridge width is defined as $s_r=\alpha s$, and the parameter $\alpha$ satisfies the condition $0 \leq \alpha \leq 1$. As $\alpha$ approaches 1, the grooves 52 narrow and the ridges 50 widen.

The planarization dielectric coating 34 conformally covers and fills the ridges 50 and grooves 52 in the metal body 32. Therefore, the planarization dielectric coating 34 includes a uniformly thick layer 54 and ridges 56 that project from layer 54 toward the metal body 32 for filling the grooves 52 in the metal body 32. The planarization dielectric coating 34 overlying the grooves 52 in the metal body 32 has a maximal thickness ($d_{max}$) equal to the thickness of layer 54 and ridges 56. The planarization dielectric coating 34 overlying the ridges 50 in the metal body 32 has a minimal thickness ($d_{min}$) equal to the thickness of layer 54, where $d_{min}=\beta d_{max}$ and the parameter $\beta$ satisfies the condition $0 \leq \beta \leq 1$.

Portions of planarization dielectric coating 34 filling and overlying the grooves 52 have a specific capacitance given by:

$$C^{1D}_{groove}(F/m^2) = \varepsilon_r \varepsilon_0 \frac{1 \times Ns(1-\alpha)}{d_{max}} = \frac{\varepsilon_r \varepsilon_0 (1-\alpha)}{d_{max}}$$

where N is number of grooves 52 per unit length and $\varepsilon_r$ is the dielectric constant of the planarization dielectric coating 34. Similarly, portions of planarization dielectric coating 34 overlying the ridges 50 have a specific capacitance given by:

$$C^{1D}_{ridge}(F/m^2) = \frac{\varepsilon_r \varepsilon_0 \alpha}{d_{min}}$$

Because the specific capacitances of these portions of the planarization dielectric coating 34 are effectively connected in parallel, the total specific capacitance of the one-dimensional linear grid is given by their algebraic sum:

$$C^{1D}_{total}(F/m^2) = \frac{\varepsilon_r \varepsilon_0 (1-\alpha)}{d_{max}} + \frac{\varepsilon_r \varepsilon_0 \alpha}{d_{min}} = \varepsilon_r \varepsilon_0 \frac{(1-\alpha)d_{min}+\alpha d_{max}}{d_{min} d_{max}}$$

Replacing $d_{min}$ with $\beta d_{max}$ yields:

$$C^{1D}_{total}(F/m^2) = \frac{\varepsilon_r \varepsilon_0}{d_{max}}\left[1-\alpha\left(1-\frac{1}{\beta}\right)\right] = \frac{\varepsilon_r \varepsilon_0}{d_{max}}\left[1-\alpha+\frac{\alpha}{\beta}\right]$$

If the grooves 52 are very wide so that $\alpha$ approaches 0, the total specific capacitance has a minimum value given by:

$$C^{1D}_{min}(F/m^2) = \frac{\varepsilon_r \varepsilon_0}{d_{max}}$$

And, if grooves 52 are very narrow so that $\alpha$ approaches 1, the total specific capacitance has a maximum value given by:

$$C^{1D}_{max}(F/m^2) = \frac{\varepsilon_r \varepsilon_0}{d_{min}}$$

Figure 4:
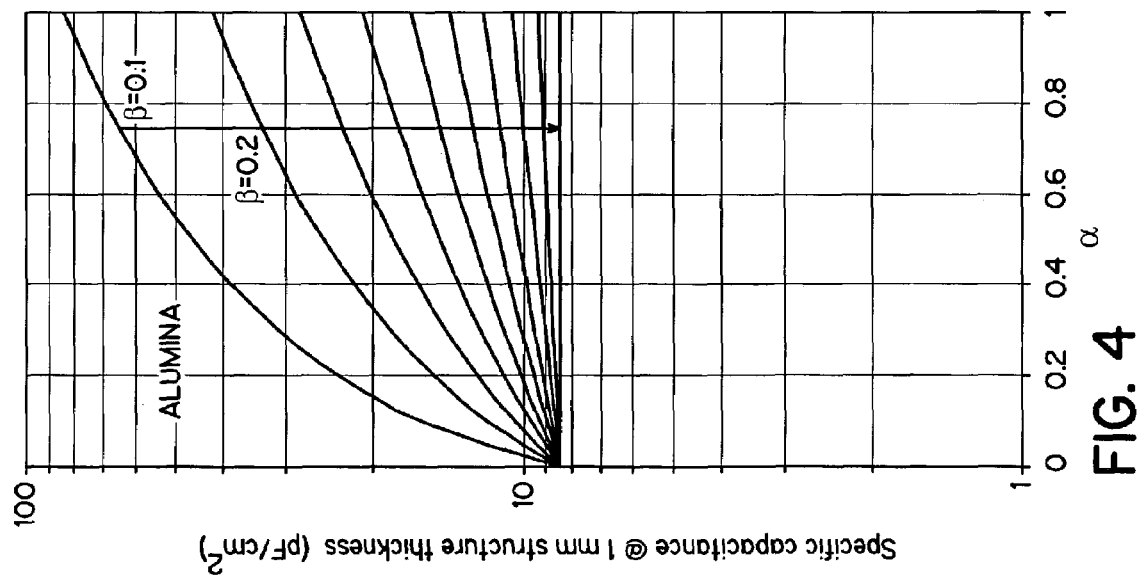
FIG. 4 is a graphical view of the total specific capacitance of the planarization dielectric layer filling the compensating structure of the electrostatic chuck of FIG. 3.

With reference to FIG. 4, the total specific capacitance of the dielectric material of the planarization dielectric coating 34 filling and overlying the one-dimensional linear grid of grooves 52 and ridges 56 (FIGS. 3, 3A) is graphically illustrated as a function of the parameters $\alpha$ and $\beta$, in which alumina ($\varepsilon_r=9.5$) is chosen as the dielectric material constituting the planarization dielectric coating 34 and the maximal thickness of the planarization dielectric coating 34 is 1 mm. Generally, the total specific capacitance increases with increasing $\alpha$ for constant $\beta$, which denotes that the total specific capacitance increases as the grooves 52 narrow. Generally, the total specific capacitance decreases with increasing $\beta$ for constant $\alpha$, which denotes that the total specific capacitance decreases as the difference between the minimal and maximal lessens. The total specific capacitance may be displayed graphically, as in FIG. 4, for other dielectric materials having a different dielectric constant, such as quartz ($\varepsilon_r=3.8$), in which case the family of curves will shift vertically. Electrostatic chucks may be designed with one-dimensional linear grids (FIG. 3) selected using FIG. 4 as a guideline in order to compensate for observed radial inhomogeneities or non-uniformities in plasma parameters, such as electron density, electron temperature, or plasma potential, or process parameters such as etch rate, deposition rate, and film thickness.

Figure 5:
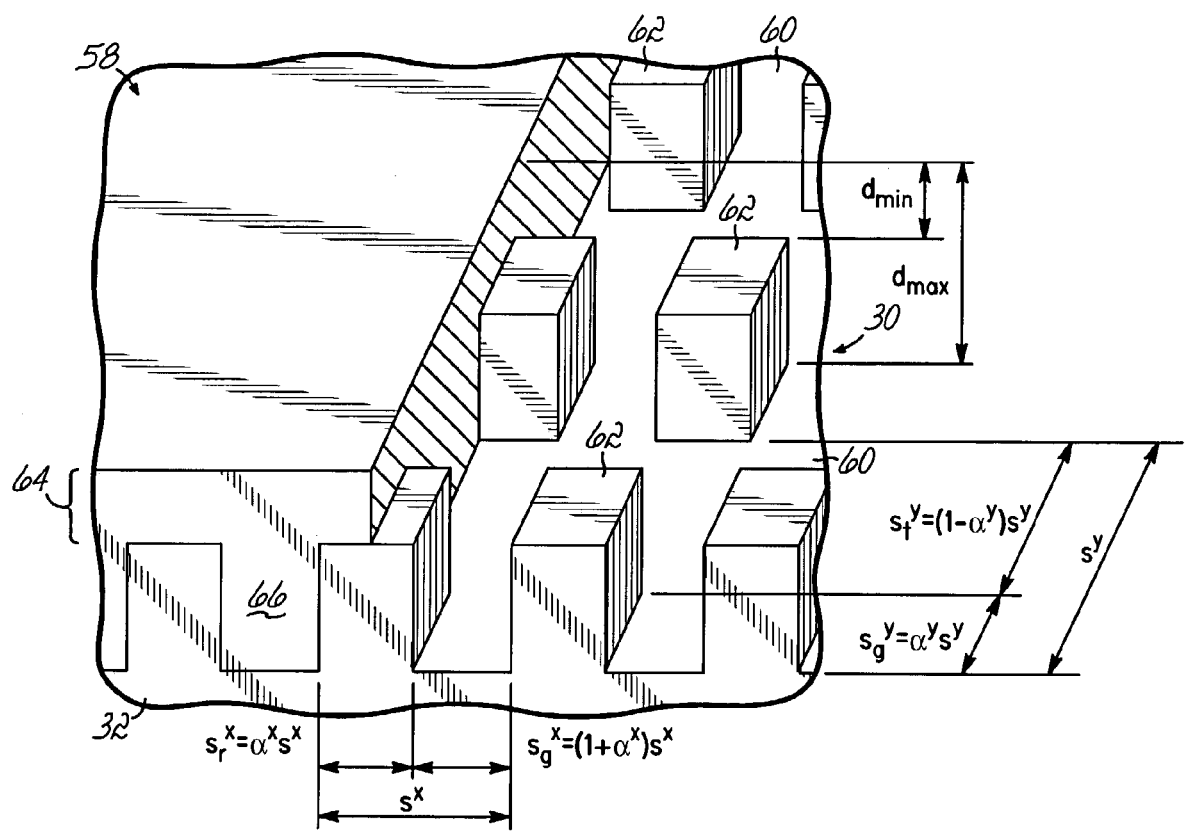
FIG. 5 is a fragmentary perspective view similar to FIG. 3 of an alternative embodiment of the electrostatic chuck.
Figure 5A:
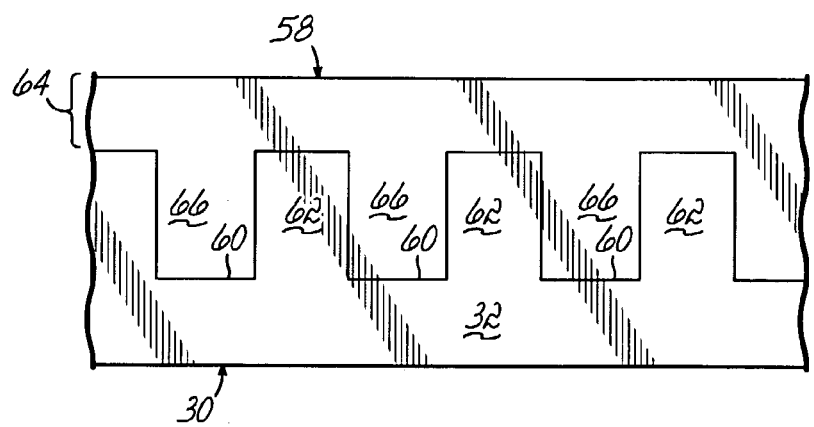
FIG. 5A is a side view of FIG. 5.

With reference to FIGS. 5 and 5A and in accordance with another embodiment of electrostatic chuck 30, metal body 32 includes a two-dimensional grid having interlaced, crossing rows of parallel, equally-spaced voids or grooves 60 that intersect to define a plurality of posts or columns 62. A planarization dielectric coating 58 conformally covers and fills the grooves 60 and columns 62 in the metal body 32. Therefore, the planarization dielectric coating 58 includes a uniformly thick layer 64 and ridges 66 that project from layer 64 toward the metal body 32 at locations that fill the grooves 60 in the metal body 32. The portion of the planarization dielectric coating 58 filling and overlying the grooves 60 has a specific capacitance of:

$$C^{2D}_{groove}(F/m^2) = \frac{\varepsilon_r \varepsilon_0}{d_{max}} \times \frac{s^x_t s^y_t}{s^x s^y}$$

The portion of the planarization dielectric coating 58 overlying the columns 62 has a specific capacitance of:

$$C^{2D}_{ridge}(F/m^2) = \frac{\varepsilon_r \varepsilon_0}{d_{max}} \times \frac{s^x_g s^y_g}{s^x s^y}$$

The total specific capacitance of the two-dimensional rectangular grid is given by:

$$C^{2D}_{groove}(F/m^2) = \frac{\varepsilon_r \varepsilon_0}{d_{max}}\left[\frac{\alpha^x \alpha^y}{\beta}+(1-\alpha^x)(1-\alpha^y)\right]$$

in which the superscripts "x" and "y" refer to the x and y directions, respectively.

Assuming that the grid is proportional in the x and y directions, e.g. $\alpha = \alpha^x = \alpha^y$, the total specific capacitance can be written as:

$$C_{total}^{2D} \ (F/m^2) = \frac{\varepsilon_r \varepsilon_0}{d_{max}} \left[ \frac{\alpha^2}{\beta} + (1-\alpha)^2 \right]$$

Figure 6:
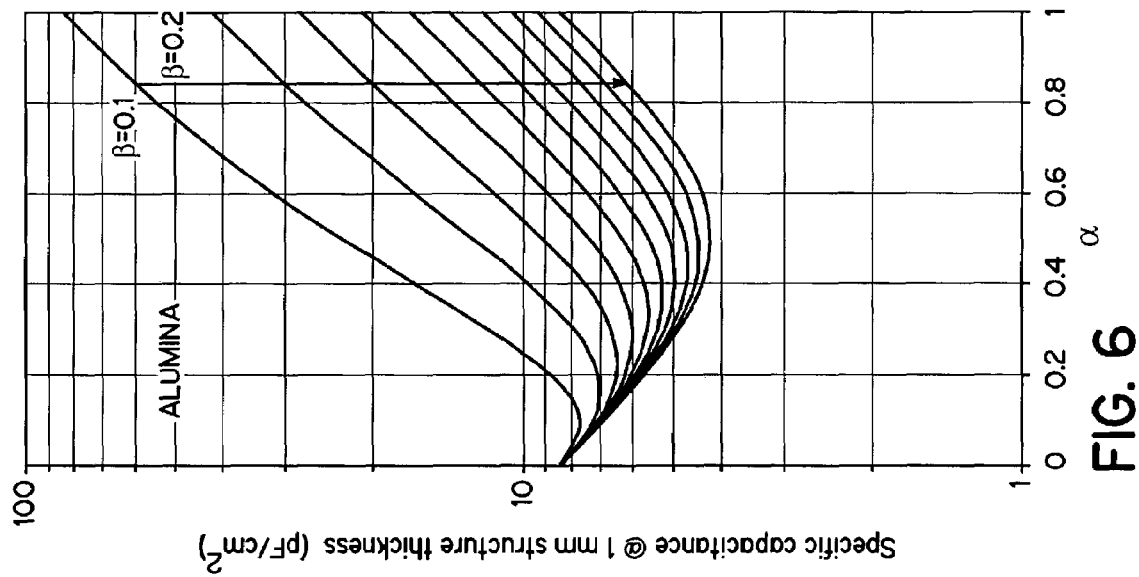
FIG. 6 is a graphical view of the total specific capacitance of the planarization dielectric layer filling the compensating structure of the electrostatic chuck of FIG. 5.

With reference to FIG. 6, the total specific capacitance of the dielectric material of the planarization dielectric coating 58 filling and overlying the two-dimensional rectangular grid of grooves 60 and columns 62 (FIGS. 5, 5A) is graphically displayed as a function of $\alpha$ and $\beta$, in which alumina ($\varepsilon_r$=9.5) is chosen as the dielectric material and the maximal thickness of the planarization dielectric coating 58 is 1 mm. Generally, the total specific capacitance decreases with increasing $\alpha$ for constant $\beta$ to an inflection point and increases from the inflection point to a maximum as $\alpha$ continues to increase. Generally, the total specific capacitance decreases with increasing $\beta$ for constant $\alpha$, which denotes that the total specific capacitance decreases as the difference between the minimal and maximal lessens. Similar to the family of curves depicted FIG. 4, electrostatic chucks may be designed with two-dimensional linear grids (FIG. 5) selected using FIG. 6 as a guideline in order to compensate for observed radial inhomogeneities or non-uniformities in plasma parameters or process parameters.

Figure 7:
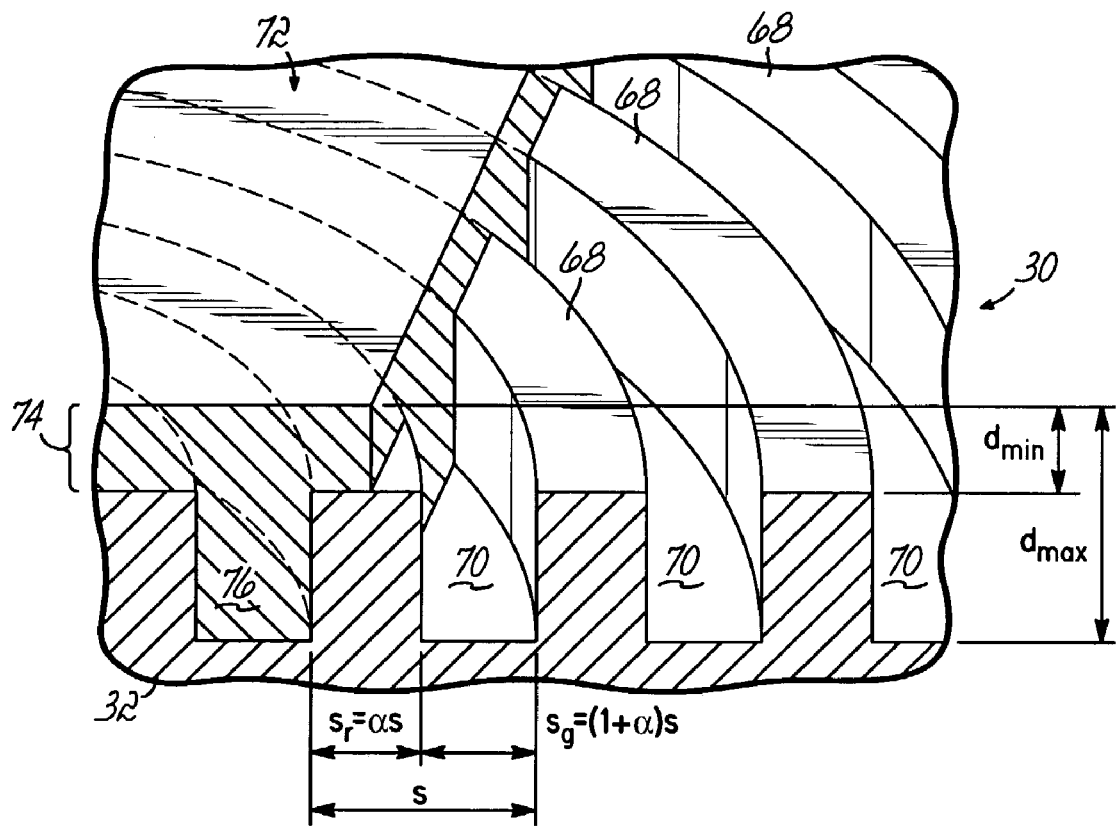
FIG. 7 is a fragmentary perspective view similar to FIG. 3 of an alternative embodiment of the electrostatic chuck.
Figure 7A:
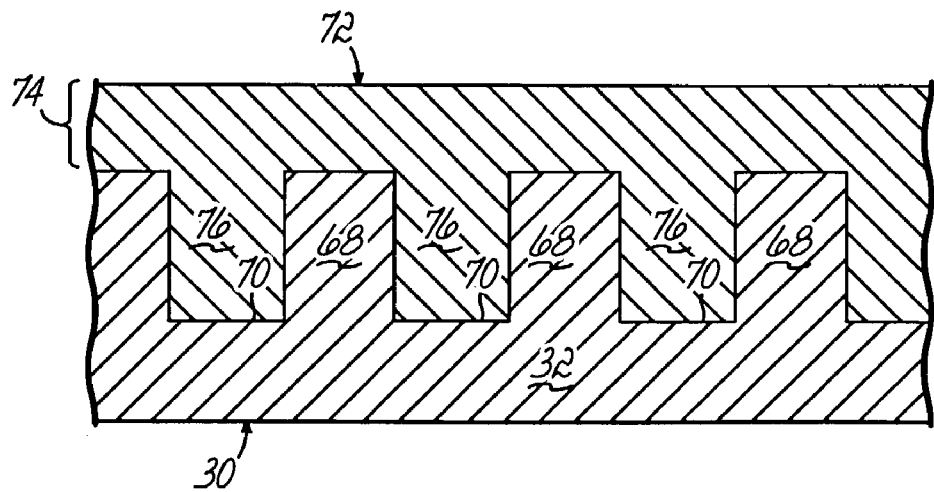
FIG. 7A is a side view of FIG. 7.

With reference to FIGS. 7 and 7A and in accordance with one embodiment of electrostatic chuck 30, metal body 32 includes a plurality of circular ridges 68 arranged in a mutually concentric relationship, in which adjacent ridges 68 are spaced apart by one of a plurality of circular voids or grooves 70. The ridges 68 all have the same radial dimension, as do the grooves 70. A planarization dielectric coating 72 conformally covers and fills the ridges 68 and grooves 70 in the metal body 32. Therefore, the planarization dielectric coating 72 includes a uniformly thick layer 74 and ridges 76 that project from layer 74 toward the metal body 32 at locations that fill the grooves 70 in the metal body 32. At relatively large radiuses, the curvature of the ridges 68, 76 and grooves 70 may be neglected and the planarization dielectric coating 72 filling and overlying the ridges 68, 76 and grooves 70 may be approximated as linear features having a specific capacitance of:

$$C_{total}^{concentric} \ (F/m^2) \approx \frac{\varepsilon_r \varepsilon_0}{d_{max}} \left[ 1 - \alpha + \frac{\alpha}{\beta} \right]$$

which is independent of radius. For relatively small radiuses, the specific capacitance of the planarization dielectric coating 72 is a function of the radius and may be written as:

$$C_{total}^{concentric} \ (F/m^2) \approx \frac{\varepsilon_r \varepsilon_0}{d_{max}} \left[ 1 - \alpha + \frac{\alpha}{\beta} - \alpha(1-\alpha)\left(1 - \frac{1}{\beta}\right)\frac{s}{2r} \right]$$

Figure 8:
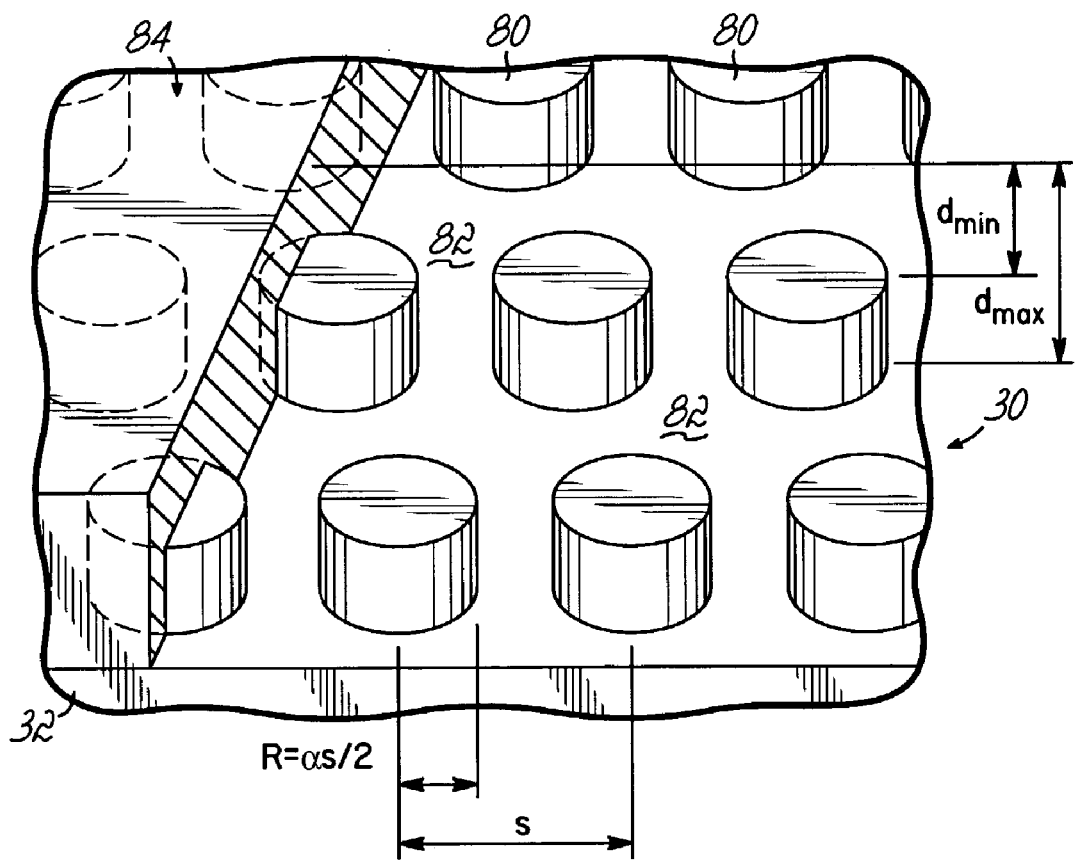
FIG. 8 is a fragmentary perspective view similar to FIG. 3 of an alternative embodiment of the electrostatic chuck.
Figure 8A:
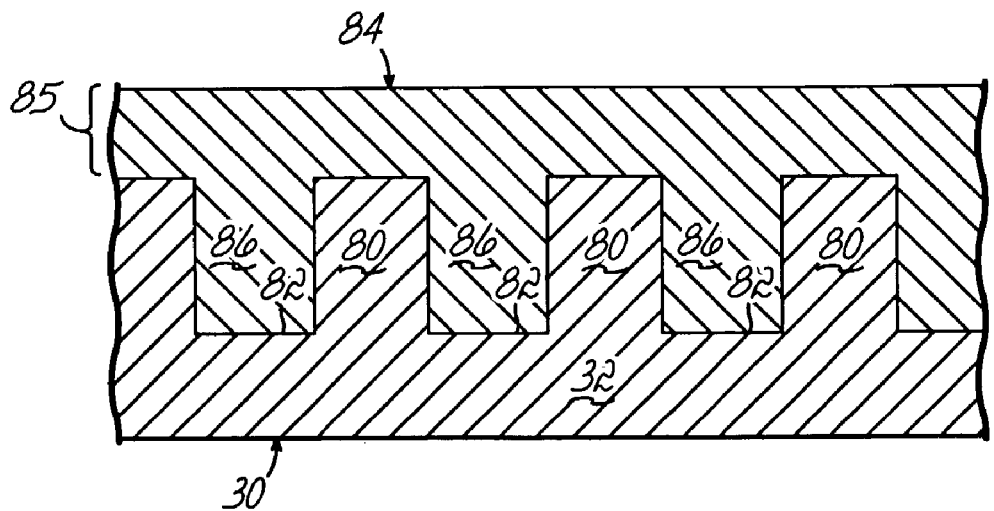
FIG. 8A is a side view of FIG. 8.

With reference to FIGS. 8 and 8A and in accordance with one embodiment of electrostatic chuck 30, the surface of metal body 32 includes a plurality of projections 80 having a height of h=(1-$\beta$) $d_{max}$ and a radius of R=$\alpha$s/2, where (s) is the center-to-center spacing between adjacent projections and $0 \leq \alpha \leq 1$. Projections 80 are defined by an intersecting set of voids or grooves 82 formed in metal body 32. A planarization dielectric coating 84 conformally covers and fills the projections 80 and grooves 82 in the metal body 32. Therefore, the planarization dielectric coating 84 includes a uniformly thick layer 85 and ridges 86 that project from layer 85 toward the metal body 32 at locations that fill the grooves 82 in the metal body 32. The total specific capacitance of the planarization dielectric coating 84 is given by:

$$C_{total}^{protrusions} \ (F/m^2) \approx \frac{\varepsilon_r \varepsilon_0}{d_{max}} \left[ 1 + \frac{\pi \alpha^2 (1-\beta)}{4\beta} \right]$$

The invention contemplates that the projections 80 may have a shape other than that of a right circular cylinder, as illustrated in FIG. 8. For example, the projections 80 may be hemispherical, pyramidal, frustopyramidal, conical, frustoconical, or any other geometrical shape apparent to a person of ordinary skill in the art.

Figure 9:
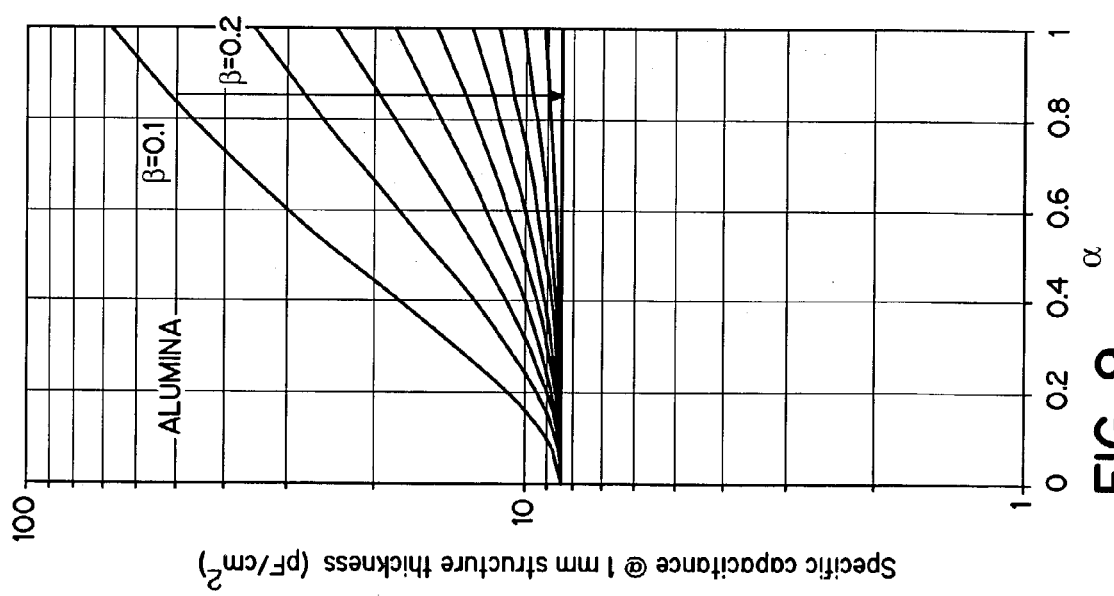
FIG. 9 is a graphical view of the total specific capacitance of the planarization dielectric layer filling the compensating structure of the electrostatic chuck of FIG. 8.

With reference to FIG. 9, the total specific capacitance of the dielectric material of the planarization dielectric coating 84 filling and overlying the projections 80 and grooves 82 (FIGS. 8, 8A) is graphically illustrated as a function of the parameters $\alpha$ and $\beta$, in which alumina ($\varepsilon_r$=9.5) is chosen as the dielectric material constituting the planarization dielectric coating 84 and the maximal thickness of the planarization dielectric coating 34 is 1 mm. Generally, the total specific capacitance increases with increasing $\alpha$ for constant $\beta$, which denotes that the total specific capacitance increases as the grooves 82 narrow. Generally, the total specific capacitance decreases with increasing $\beta$ for constant $\alpha$, which denotes that the total specific capacitance decreases as the difference between the minimal and maximal lessens. The total specific capacitance may be displayed graphically, as in FIG. 9, for other dielectric materials having a different dielectric constant, such as quartz ($\varepsilon_r$=3.8), in which case the family of curves will shift vertically. Electrostatic chucks may be designed using FIG. 9 as a guideline in order to compensate for observed radial inhomogeneities or non-uniformities in plasma parameters or process parameters.

Figure 10:
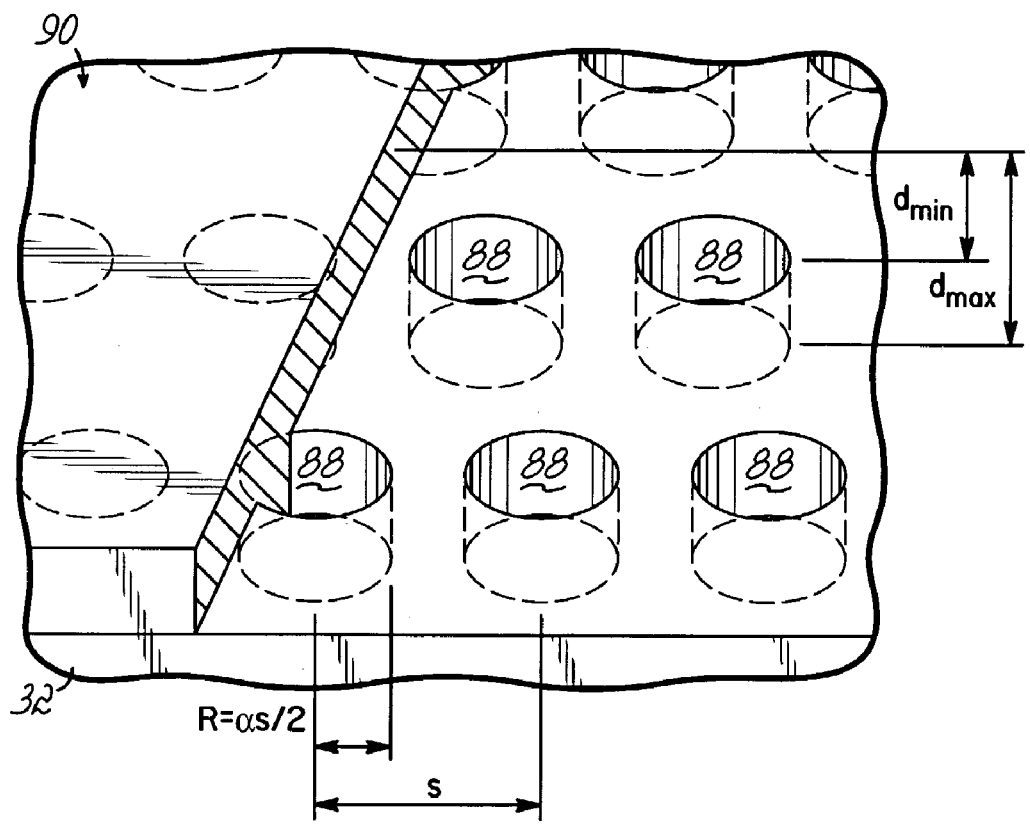
FIG. 10 is a fragmentary perspective view similar to FIG. 3 of an alternative embodiment of the electrostatic chuck.
Figure 10A:
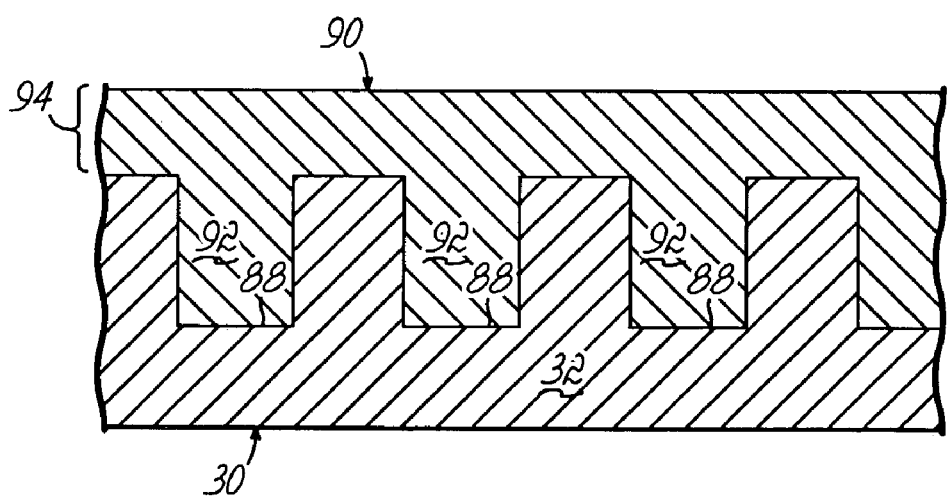
FIG. 10A is a side view of FIG. 10.

With reference to FIGS. 10 and 10A and in accordance with one embodiment of electrostatic chuck 30, metal body 32 includes a plurality of recesses 88 each having a depth h=(1-$\beta$)$d_{max}$. Each recess 88 has a radius given by R=$\alpha$s, where s is the center-to-center spacing between adjacent recesses 88 in any given row of recesses 88. A planarization dielectric coating 90 conformally covers the metal body 32. The planarization dielectric coating 90 has projections 92 that fill the recesses 88 and a uniformly thick layer 94 that covers the metal body 32. The total specific capacitance of the planarization dielectric coating 90 is given by:

$$C_{total}^{recesses} \ (F/m^2) \approx \frac{\varepsilon_r \varepsilon_0}{d_{max}} \left[ \frac{1}{\beta} - \frac{\pi \alpha^2 (1-\beta)}{4\beta} \right]$$

The invention contemplates that the recesses 88 may have a shape other than that of a right circular cylinder, as illustrated in FIG. 10. For example, the recesses 88 may be hemispherical, pyramidal, frustopyramidal, conical, frustoconical, or any other geometrical shape apparent to a person of ordinary skill in the art.

Figure 11:
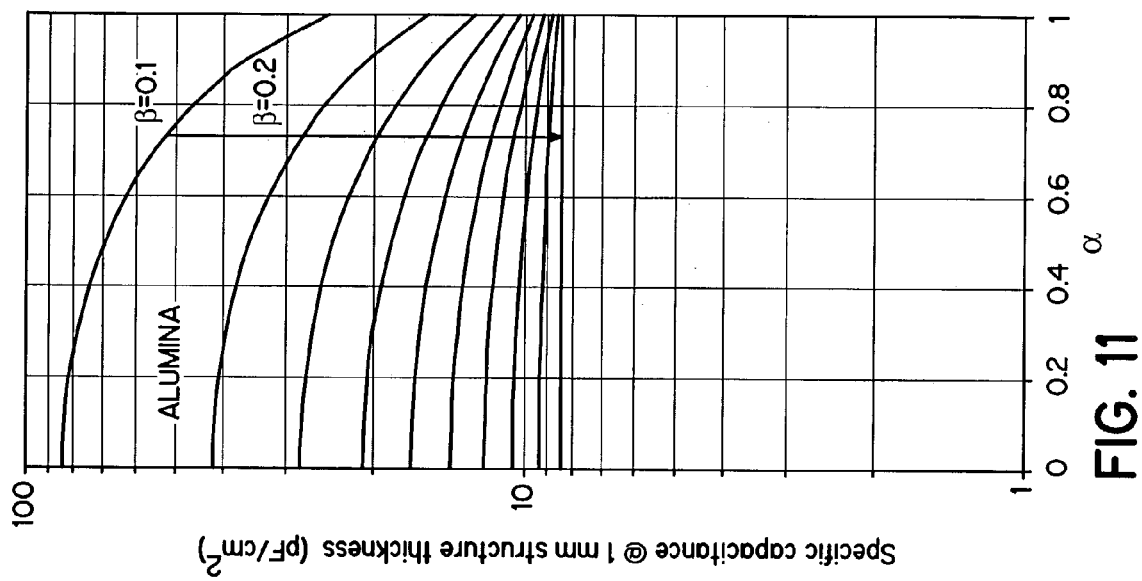
FIG. 11 is a graphical view of the total specific capacitance of the planarization dielectric layer filling the compensating structure of the electrostatic chuck of FIG. 10.

With reference to FIG. 11, the total specific capacitance of the dielectric material the planarization dielectric coating 90 filling and overlying recesses 88 (FIGS. 10, 10A) is graphically displayed as a function of $\alpha$ and $\beta$, in which alumina ($\epsilon_r$=9.5) is chosen as the dielectric material and the maximal thickness of the planarization dielectric coating 90 is 1 mm. Generally, the total specific capacitance decreases with increasing α for constant β, which denotes that the total specific capacitance decreases as the recesses 88 narrow. Generally, the total specific capacitance decreases with increasing β for constant α, which denotes that the total specific capacitance decreases as the difference between the minimal and maximal lessens. Electrostatic chucks may be designed using FIG. 11 as a guideline in order to compensate for observed radial inhomogeneities or non-uniformities in plasma parameters or process parameters.

Figure 12:
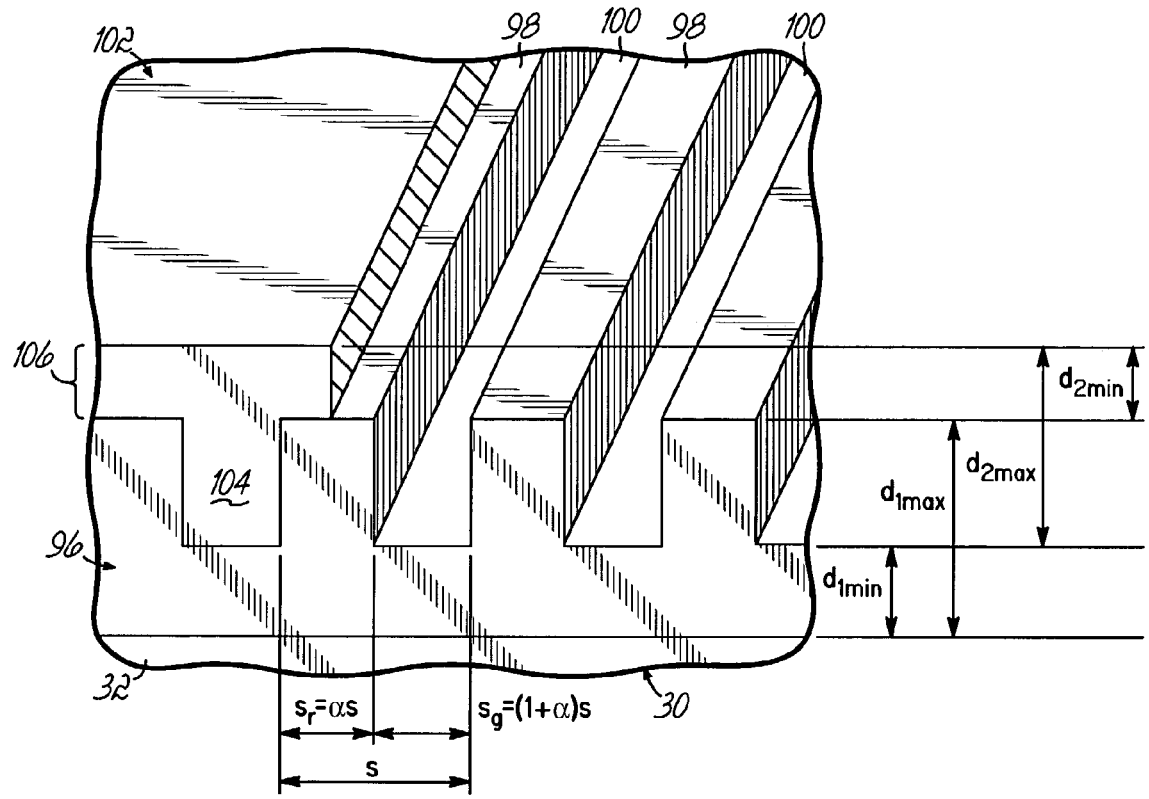
FIG. 12 is a fragmentary perspective view similar to FIG. 3 of an alternative embodiment of the electrostatic chuck.
Figure 12A:
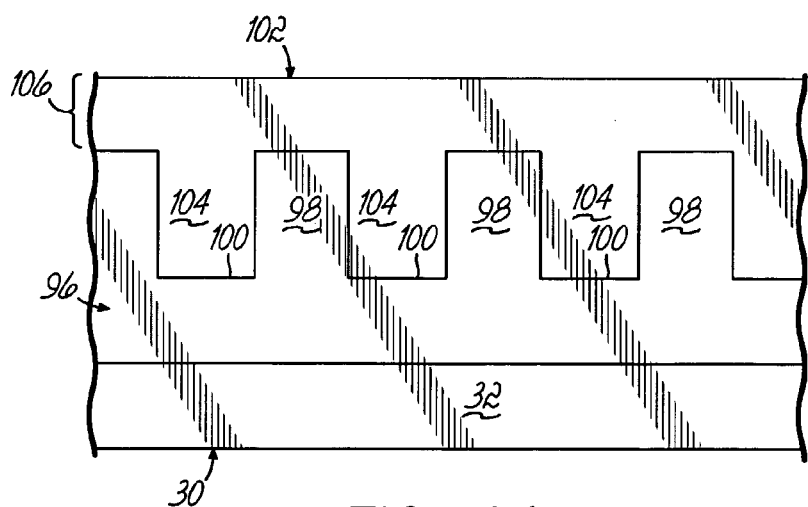
FIG. 12A is a side view of FIG. 12.

With reference to FIGS. 12 and 12A and in accordance with an alternative embodiment of the invention, a dielectric coating 96 covers metal body 32. Dielectric coating 96 is structured with a linear one-dimensional grid of ridges 98 in which adjacent ridges 98 are separated by one of multiple voids or grooves 100. A planarization dielectric coating 102 conformally covers and fills the ridges 98 and grooves 100 in the dielectric coating 96. Planarization dielectric coating 102 has a uniformly thick layer 106 and multiple ridges 104 that fill the grooves 100. To control the specific capacitance, the two dielectric coatings 96, 102 are formed from different dielectric materials, selected from among alumina, quartz and another materials having appropriate dielectric constants. In one embodiment, the planarization dielectric coating 102 may be formed from alumina and the dielectric coating 96 may be formed from quartz.

The ridges 98 and grooves 100 in the dielectric coating 96 have a periodicity given by a pitch $s=s_g+s_r$, a groove width defined as $s_g=(1-\alpha)s$, and a ridge width given by the relation $s_r=\alpha s$, where $0 \leq \alpha \leq 1$. The step height between the ridges 98 and grooves 100 is estimated as the difference between the maximal and minimal thickness of the structured dielectric layer given by $h_1=d_{1\ max}-d_{1\ min}$, where $d_{1\ min}=\beta_1 d_{1\ max}$ and $0 \leq \beta_1 \leq 1$. The ridges 104 in the planarization dielectric coating 102 are complementary to the grooves 100 in the dielectric coating 96 as the dielectric material of ridges 104 fills the grooves 100. The step height of the planarization dielectric coating 102 is the difference between the maximal and minimal thicknesses given by $h_2=d_{2\ max}-d_{2\ min}$, where $d_{2\ min}=\beta_1 d_{2\ max}$ and $0 \leq \beta_1 \leq 1$.

After mathematical manipulation, the total specific capacitance of the dielectric coatings 96, 102 is given by:

$$C_{total\ bilayer}^{1D}\ (F/m^2) = \varepsilon_{1r}\varepsilon_{2r}\varepsilon_0 \left[ \frac{(1-\alpha)}{\varepsilon_{1r}d_{2max}+\varepsilon_{2r}d_{1min}} + \frac{\alpha}{\varepsilon_{1r}d_{2min}+\varepsilon_{2r}d_{1max}} \right]$$

Figure 13:
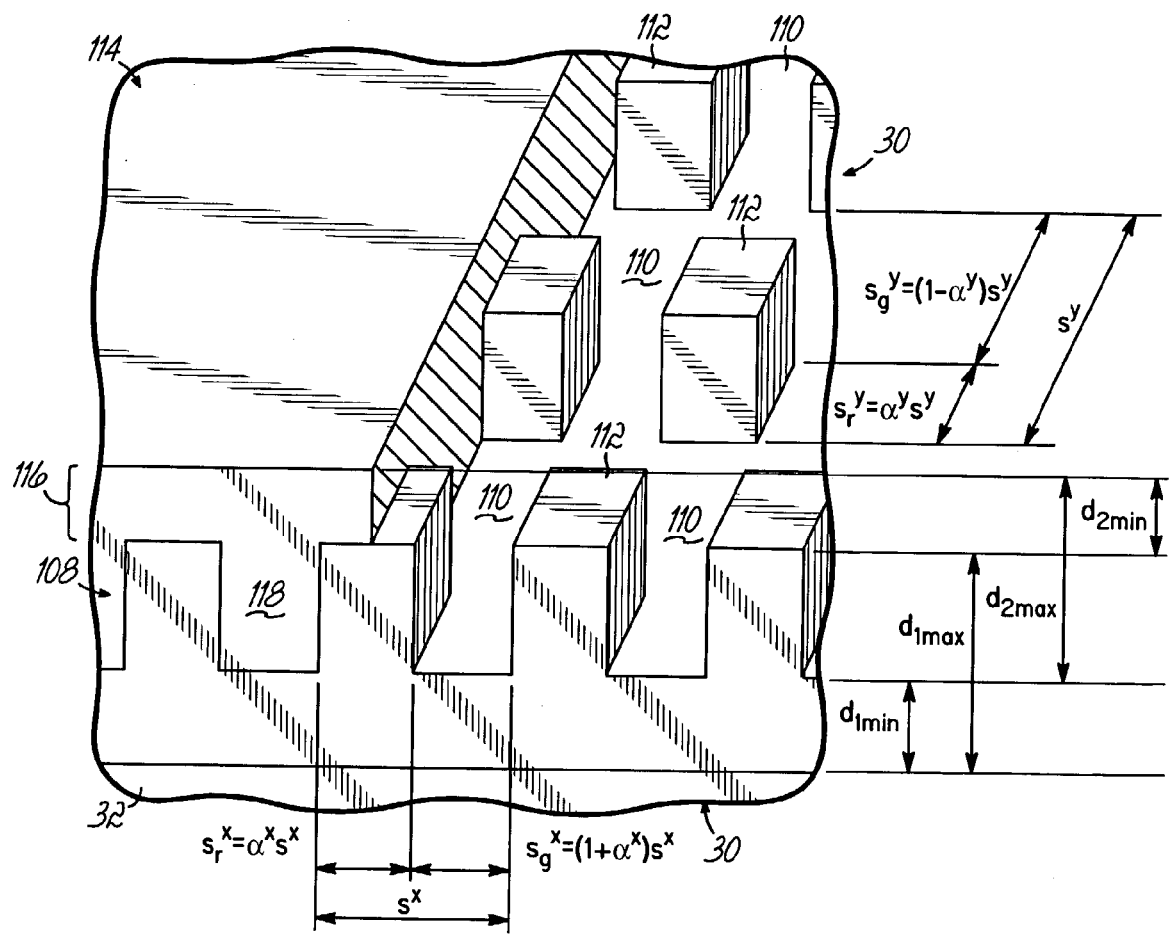
FIG. 13 is a fragmentary perspective view similar to FIG. 3 of an alternative embodiment of the electrostatic chuck.
Figure 13A:
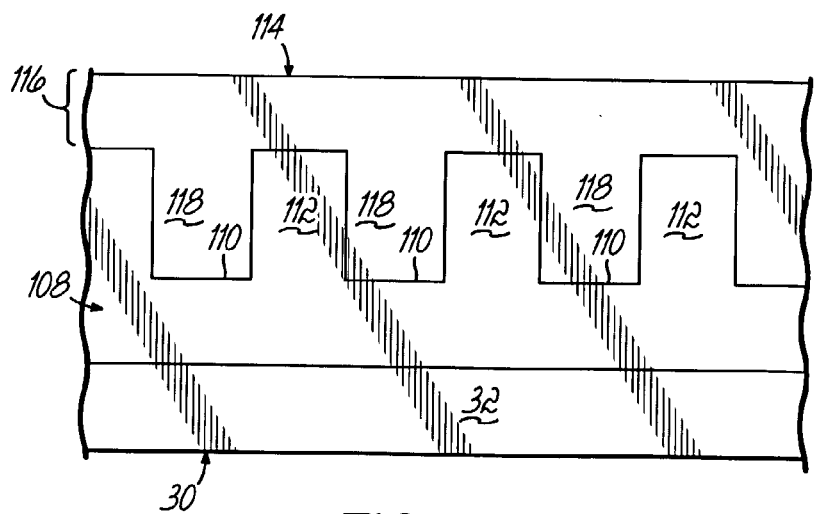
FIG. 13A is a side view of FIG. 13.

With reference to FIGS. 13 and 13A and in accordance with an alternative embodiment of the invention, a dielectric coating 108 covers metal body 32. Dielectric coating 108 includes a two-dimensional grid having interlaced, crossing rows of parallel voids or grooves 110 that intersect to define a plurality of posts or columns 112. A planarization dielectric coating 114 conformally covers and fills the columns 112 and grooves 110. Planarization dielectric coating 114 has a uniformly thick layer 116 and multiple ridges 118 that fill the grooves 110. To control the specific capacitance, different dielectric materials, selected from among alumina, quartz and other materials having appropriate dielectric constants, constitute the dielectric coatings 108, 114.

The total specific capacitance of the dielectric coatings 108, 114 is given by:

$$C_{total\ bilayer}^{2D}\ (F/m^2) = \varepsilon_{1r}\varepsilon_{2r}\varepsilon_0 \left[ \frac{(1-\alpha)^2}{\varepsilon_{1r}d_{2max}+\varepsilon_{2r}d_{1min}} + \frac{\alpha^2}{\varepsilon_{1r}d_{2min}+\varepsilon_{2r}d_{1max}} \right]$$

in which the grid is proportional in the x and y directions, e.g. $\alpha=\alpha^x=\alpha^y$.

Figure 14:
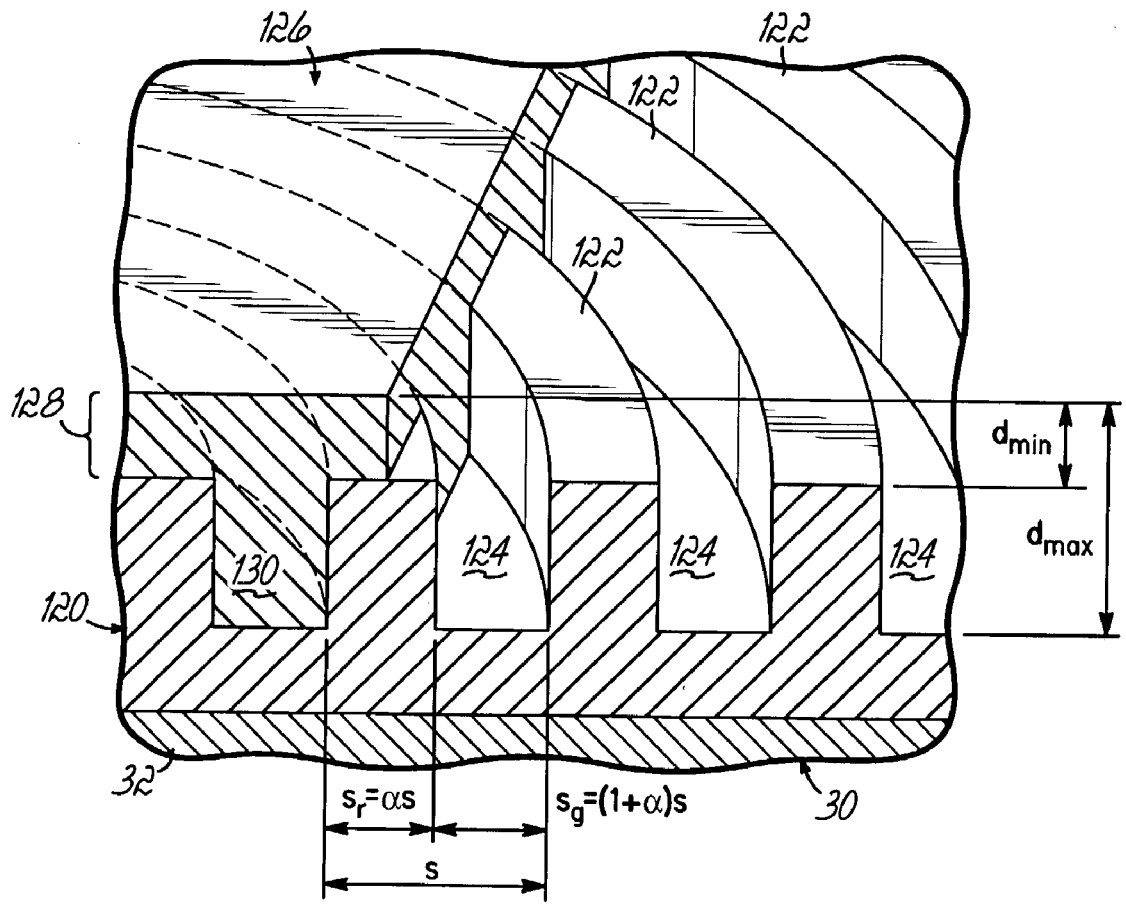
FIG. 14 is a fragmentary perspective view similar to FIG. 3 of an alternative embodiment of the electrostatic chuck.
Figure 14A:
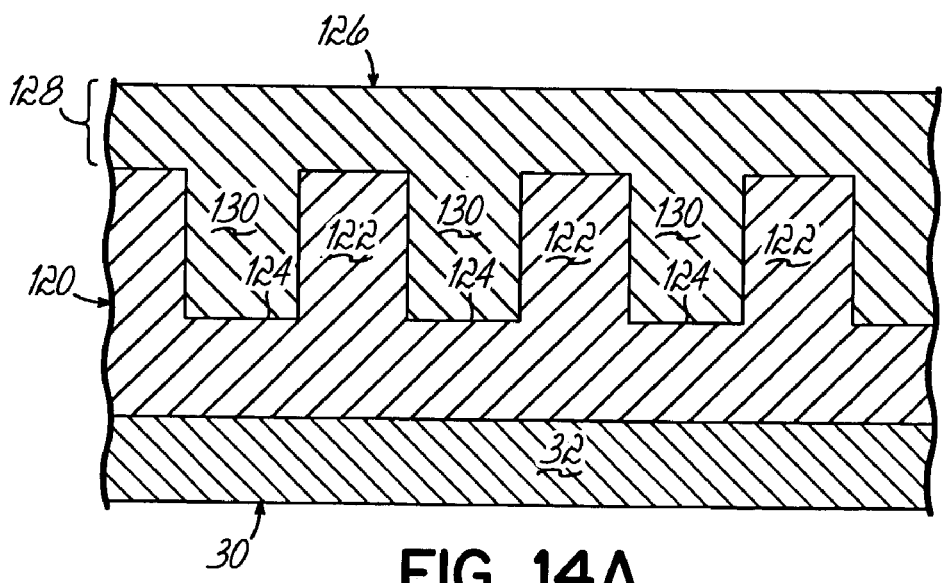
FIG. 14A is a side view of FIG. 14.

With reference to FIGS. 14 and 14A and in accordance with an alternative embodiment of the invention a dielectric coating 120 covers metal body 32. Dielectric coating 120 includes a plurality of circular ridges 122 arranged in a mutually concentric relationship, in which adjacent ridges 122 are spaced apart by one of a plurality of circular voids or grooves 124. A planarization dielectric coating 126 conformally covers and fills the ridges 122 and grooves 124. Therefore, the planarization dielectric coating 126 includes a uniformly thick layer 128 and ridges 130 that project from layer 128 for filling the grooves 124.

At relatively large radiuses, the curvature of the ridges 122 and grooves 124 may be neglected and the ridges 122 and grooves 124 may be approximated as linear features. The total specific capacitance of the dielectric coatings 120, 126 is approximately equal to:

$$C_{total\ bilayer}^{concentric}\ (F/m^2) \approx \varepsilon_{1r}\varepsilon_{2r}\varepsilon_0 \left[ \frac{(1-\alpha)}{\varepsilon_{1r}d_{2max}+\varepsilon_{2r}d_{1min}} + \frac{\alpha}{\varepsilon_{1r}d_{2min}+\varepsilon_{2r}d_{1max}} \right]$$

For relatively small radiuses, the total specific capacitance is given by:

$$C_{total\ bilayer}^{concentric}\ (F/m^2) = \frac{C_1 C_2}{C_1+C_2},\ \text{where}$$

$$C_1(F/m^2) = \varepsilon_{1r}\varepsilon_0 \left[ \frac{\alpha}{d_{1max}} + \frac{1-\alpha}{d_{1min}} + \alpha(1-\alpha)\left(\frac{1}{d_{1min}} - \frac{1}{d_{1max}}\right)\frac{s}{2r} \right]$$

$$C_2(F/m^2) = \varepsilon_{2r}\varepsilon_0 \left[ \frac{1-\alpha}{d_{2max}} + \frac{\alpha}{d_{2min}} - \alpha(1-\alpha)\left(\frac{1}{d_{2min}} - \frac{1}{d_{2max}}\right)\frac{s}{2r} \right]$$

The invention contemplates that other structures may be appropriate for adjusting the specific capacitance of the surface of the electrostatic chuck 30 (FIG. 2).

Figure 15:
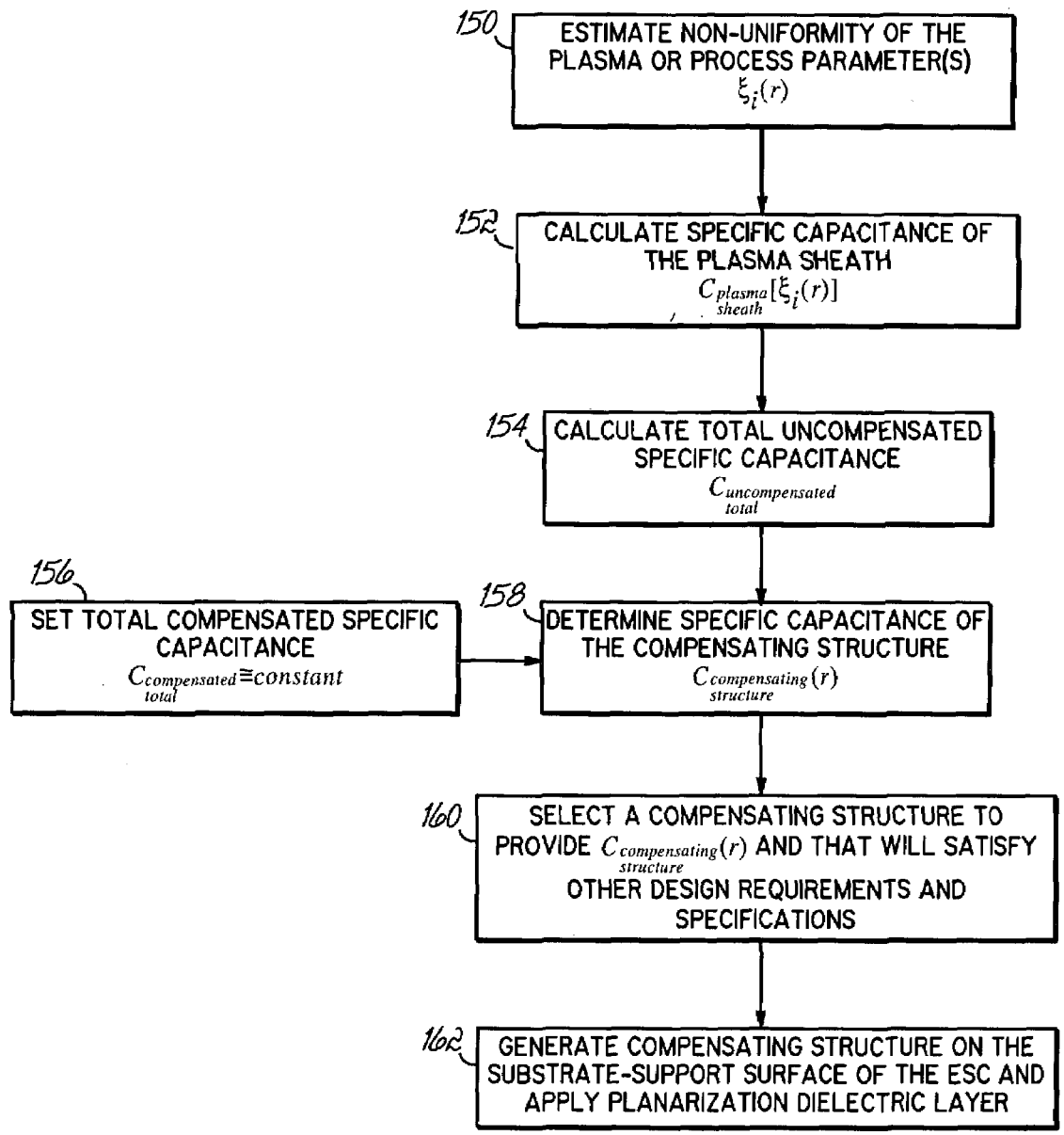
FIG. 15 is a logic flow diagram for selecting a compensating structure according to the principles of the invention.

With reference to FIG. 15, a process is described for adjusting a parameter related to plasma conditions at the substrate-supporting surface of an electrostatic chuck in order to correct a process non-uniformity relating to a parameter $\xi_i=\xi_i(r)$ relating to plasma conditions. The process non-uniformity may be characterized by a radial dependence of a plasma parameter, such as plasma density, electron temperature, and plasma potential, or by a radial dependence of another process parameter, including but not limited to etching rate, deposition rate, and film thickness, that is directly correlated with plasma parameters. In block 150, the process non-uniformity may be estimated by direct measurement of the plasma parameters near the exposed surface of the electrostatic chuck or by measurement of the process parameter, such as etch or deposition rate, from the processed substrate.

In block 152, the specific capacitance of the plasma sheath, $$C_{plasma\ sheath}(\xi(r)),$$

which is a function of radial position, is determined. In block 154, the total uncompensated specific capacitance is given by the individual specific capacitances of the plasma sheath, substrate and electrostatic chuck, which are connected in series, and is expressed as:

$$C_{total}^{uncompensated}(r) = \frac{C_{plasma\ sheath}(\xi(r))C_{substrate}C_{ESC}}{C_{substrate}C_{ESC} + C_{plasma\ sheath}(\xi(r))C_{ESC} + C_{plasma\ sheath}(\xi(r))C_{substrate}}$$

In this expression, it is appreciated that the electrostatic chuck 30 (FIG. 2) may have an existing dielectric coating on its substrate-contacting surface that contributes a specific capacitance. The specific capacitance of the substrate $C_{substrate}$ and the electrostatic chuck $C_{ESC}$ are roughly constant over the surface area of the substrate. For a 300 mm silicon substrate, $C_{wafer} \cong 13$ pF/cm² and $C_{ESC} = 15\text{-}25$ pF/cm². The total specific capacitance $$C_{total}^{uncompensated}(r)$$

has a radial dependence due to the radial dependence of the sheath specific capacitance $$C_{plasma\ sheath}(\xi(r)).$$

In block 156, the goal is to adjust the total compensated specific capacitance to be uniform and constant across the entire exposed surface area of the substrate. To that end and as in block 158, a total specific capacitance $$C_{compensating\ structure}(r)$$

for a compensating structure is added in series with the total uncompensated specific capacitance of the plasma sheath, substrate and electrostatic chuck that compensates for radial non-uniformities in the plasma sheath. The total specific capacitance satisfies the relationship:

$$C_{total}^{compensated} \cong \text{constant} \leq \min\{C_{total}^{uncompensated}(r)\}$$

The specific capacitance of the compensating structure is given by:

$$C_{compensating\ structure}(r) = \frac{C_{total}^{uncompensated}(r) \times C_{total}^{compensated}}{C_{total}^{uncompensated}(r) - C_{total}^{compensated}}$$

From expression for capacitances connected in series we can derive $$C_{compensating\ structure}(r) = \frac{\min\{C_{plasma\ sheath}(r)\} \times C_{plasma\ sheath}(r)}{C_{plasma\ sheath}(r) - \min\{C_{plasma\ sheath}(r)\}}$$

The invention contemplates that, in accordance with one embodiment of the invention, an existing dielectric coating of the electrostatic chuck may be replaced in its entirety by the compensating structure. Under this retrofitting circumstance, the specific capacitance of the electrostatic chuck will become the specific capacitance of the compensating structure.

In block 160, a compensating structure is selected from among the compensating structures illustrated in FIGS. 3, 5, 7, 8, 10, 12, 13, and 14 or other alternative compensating structures consistent with the principles of the invention. The selection of the compensating structure must also satisfy other design requirements and specifications. It is appreciated that different compensation structures can be applied to different surface areas of the electrostatic chuck 30 (FIG. 2) so that a combination of compensating structures is selected.

In block 162, the substrate-supporting surface of the electrostatic chuck is modified to physically generate a pattern of features characteristic of the compensating structure. The features may be formed by techniques including, but not limited to, micro-machining, laser surface engineering or plasma deep structuring (Bosch process) and wet chemical etching. It is appreciated by persons of ordinary skill in the art that the substrate-supporting surface in which the features are formed may be constituted by metal or by a dielectric coating of a material having a dielectric constant different from the dielectric constant of the planarization dielectric coating. Finally, the substrate-supporting surface is conformally coated with the planarization dielectric coating to fill the pattern of features with dielectric material to provide the compensating structure. The substrate-supporting surface may be planarized by a polishing process, such as chemical mechanical polishing, after deposition.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicant's general inventive concept.

I claim:

1. An electrostatic chuck for a plasma processing system capable of generating a plasma having a plasma sheath, comprising:

a chuck body including a pattern of features; and
a dielectric body supported by said chuck body, said dielectric body including a dielectric layer of substantially uniform thickness defining a substrate-supporting surface and a plurality of dielectric portions positioned between said chuck body and said dielectric layer, each of said dielectric portions filling a corresponding one of said features, said dielectric layer and said dielectric portions having a specific capacitance capable of compensating for a radial non-uniformity in a specific capacitance of the plasma sheath adjacent to said substrate-supporting surface.

2. The electrostatic chuck of claim 1 wherein said pattern of features includes a plurality of linear ridges and a plurality of linear grooves, adjacent pairs of said plurality of linear ridges being separated by one of said plurality of linear grooves.

3. The electrostatic chuck of claim 1 wherein said pattern of features includes a plurality of columns, a plurality of first linear grooves, and a plurality of second Linear grooves orthogonal to said plurality of first linear grooves, each of said plurality of columns being defined by the intersection of a pair of said plurality of said first linear grooves with a pair of said plurality of second linear grooves.

4. The electrostatic chuck of claim 1 wherein said pattern of features includes a plurality of concentric ridges and a plurality of concentric grooves, adjacent pairs of said plurality of concentric ridges being separated by one of said plurality of concentric grooves.

5. The electrostatic chuck of claim 1 wherein said pattern of features includes a plurality of recesses formed in said chuck body.

6. The electrostatic chuck of claim 1 wherein said chuck body further comprises:
a second dielectric material underlying said first dielectric material, said pattern of features being formed in the second dielectric material, and the second dielectric material having a different dielectric constant than the first dielectric material.

7. A plasma processing system comprising:
a processing chamber;
a plasma generator operative for generating a plasma inside said processing chamber, the plasma having a plasma sheath with a radial non-uniformity at said substrate-supporting surface; and
an electrostatic chuck inside said plasma chamber, said electrostatic chuck including a chuck body with a pattern of features and a dielectric body supported by said chuck body, said dielectric body including a dielectric layer of substantially uniform thickness defining a substrate-supporting surface and a plurality of dielectric portions positioned between said chuck body and said dielectric layer, each of said dielectric portions filling a corresponding one of said features said dielectric layer and said dielectric portions having a specific capacitance capable of compensating for a radial non-uniformity in a specific capacitance of the plasma sheath adjacent to said substrate-supporting surface.

8. The plasma processing system of claim 7 wherein said pattern of features includes a plurality of linear ridges and a plurality of linear grooves, adjacent pairs of said plurality of linear ridges being separated by one of said plurality of linear grooves.

9. The plasma processing system of claim 7 wherein said pattern of features includes a plurality of columns, a plurality of first liner grooves, and a plurality of second linear grooves orthogonal to said plurality of first linear grooves, each of said plurality of columns being defined by the intersection of a pair of said plurality of said first linear grooves with a pair of said plurality of second liner grooves.

10. The plasma processing system of claim 7 wherein said pattern of features includes a plurality of concentric ridges and a plurality of concentric grooves, adjacent pairs of said plurality of concentric ridges being separated by one of said plurality of concentric grooves.

11. The plasma processing system of claim 7 wherein said pattern of features includes a plurality of recesses formed in said chuck body.

12. The plasma processing system of claim 7 wherein said chuck body further comprises:
a second dielectric material underlying said first dielectric material, said pattern of features being formed in the second dielectric material, and the second dielectric material having a different dielectric constant than the first dielectric material.

13. A method to compensate for a radial non-uniformity of a plasma-related parameter at a substrate-supporting surface of an electrostatic chuck, the radial non-uniformity produced by a radial non-uniformity in a plasma sheath of a plasma adjacent the electrostatic chuck, comprising:
characterizing the radial non-uniformity in the plasma-related parameter at the substrate-supporting surface;
selecting a compensating structure having a specific capacitance capable of substantially compensating for the radial non-uniformity in the plasma sheath;
modifying the substrate-supporting surface of a chuck body to provide a pattern of features characteristic of the compensating structure; and
forming a coating of a first dielectric material on the modified substrate-supporting surface of the chuck body filling the pattern of features to provide the compensating structure and covering the pattern of features to reposition the substrate-supporting surface.

14. The method of claim 13 further comprising:
processing a substrate placed on the substrate-supporting surface with the plasma before the substrate-supporting surface is modified; and
measuring the plasma-related parameter from the processed substrate.

15. The method of claim 14 wherein the plasma-related parameter is selected from the group consisting of etching rate, deposition rate, and film thickness.

16. The method of claim 13 further comprising:
measuring the plasma-related parameter adjacent the substrate-supporting surface before the substrate-supporting surface is modified.

17. The method of claim 16 wherein the plasma-related parameter is selected from the group consisting of plasma density, electron temperature, and plasma potential.

18. The method of claim 13 further comprising:
calculating the specific capacitance of the plasma sheath adjacent the substrate-supporting surface from the plasma-related parameter.

19. The method of claim 18 wherein determining the specific capacitance of the compensating structure further comprises:
using the specific capacitance of the plasma sheath to determine the specific capacitance of the coating of the first dielectric material.

20. The method of claim 13 wherein the first dielectric material coating includes a plurality of parallel specific capacitances defined by the dielectric portions filling the pattern of features.

21. The method of claim 13 wherein modifying the substrate-supporting surface further comprises:
removing material from the substrate-supporting surface to form a plurality of linear grooves therein, adjacent pairs of the plurality of linear grooves ridges being separated by one of a plurality of linear ridges.

22. The method of claim 13 wherein modifying the substrate-supporting surface further comprises:
removing material from the substrate-supporting surface to form a first plurality of linear grooves and a second plurality of linear grooves aligned substantially orthogonally to the first plurality of linear grooves, each intersection of a pair of the first linear grooves with a pair of the second plurality of linear grooves defining one of a plurality of columns.

23. The method of claim 13 wherein modifying the substrate-supporting surface further comprises:
removing material from the substrate-supporting surface to form a plurality of concentric grooves, adjacent pairs of the plurality of concentric grooves being separated by one of a plurality of concentric ridges.

24. The method of claim 13 wherein modifying the substrate-supporting surface further comprises:
removing material from the substrate-supporting surface to form a plurality of recesses.

25. The method of claim 13 further comprising:
covering the substrate-supporting surface with a coating of a second dielectric material before the substrate-supporting surface is modified wit the pattern of features, the pattern of features being formed in the second dielectric material and the second dielectric material having a different dielectric constant than the first dielectric material.

26. The method of claim 13 further comprising:
determining a specific capacitance of the plasma sheath from the radial non-uniformity in the plasma sheath, and selecting the compensating structure based upon the specific capacitance of the plasma sheath.

* * * * *

UNITED STATES PATENT AND TRADEMARK OFFICE
CERTIFICATE OF CORRECTION

PATENT NO. : 7,075,771 B2  Page 1 of 1
APPLICATION NO. : 10/442815
DATED : July 11, 2006
INVENTOR(S) : Jozef Brcka It is certified that error appears in the above-identified patent and that said Letters Patent is hereby corrected as shown below:

Column 9:
Line 14, change "αandβ" to --α and β--.
Line 18, change "as a" to --as α--.
Line 58, change "≈" to --=--.

Column 15:
Line 20, change "Linear" to --linear--.
Line 54, after "features" insert --,--.
Line 67, change "liner" to --linear--.

Column 16:
Line 4, change "liner" to --linear--.

Column 18:
Line 8, change "wit" to --with--

Signed and Sealed this

Twenty-ninth Day of May, 2007

JON W. DUDAS
*Director of the United States Patent and Trademark Office*